(12) United States Patent
Fotou et al.

(10) Patent No.: US 8,058,195 B2
(45) Date of Patent: Nov. 15, 2011

(54) NANOGLASS AND FLAME SPRAY PROCESSES FOR PRODUCING NANOGLASS

(75) Inventors: George Fotou, Albuquerque, NM (US); Mark Hampden-Smith, Albuquerque, NM (US); Mark Kowalski, Albuquerque, NM (US); Hyungrak Kim, Albuquerque, NM (US); Toivo Kodas, Carlisle, MA (US); Ned Hardman, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 494 days.

(21) Appl. No.: 12/142,639

(22) Filed: Jun. 19, 2008

(65) Prior Publication Data
US 2008/0318757 A1    Dec. 25, 2008

Related U.S. Application Data

(63) Continuation-in-part of application No. 11/765,313, filed on Jun. 19, 2007.

(51) Int. Cl.
| | |
|---|---|
| *C03C 6/08* | (2006.01) |
| *C03C 6/02* | (2006.01) |
| *B32B 5/16* | (2006.01) |
| *B32B 9/00* | (2006.01) |
| *B32B 15/02* | (2006.01) |
| *B32B 17/02* | (2006.01) |

(52) U.S. Cl. ............... 501/29; 501/27; 428/402
(58) Field of Classification Search ............ 501/14, 501/16, 21, 22, 23, 24, 26, 27, 29; 428/357, 428/402; 264/109, 113, 29.3; 510/444
See application file for complete search history.

(56) References Cited

U.S. PATENT DOCUMENTS

| | | | |
|---|---|---|---|
| 3,957,694 A | 5/1976 | Bolon et al. |
| 4,051,074 A | 9/1977 | Asada |
| 4,388,346 A | 6/1983 | Bickler et al. |
| 4,487,811 A | 12/1984 | Eichelberger et al. |
| 4,594,311 A | 6/1986 | Frisch et al. |
| 4,697,041 A | 9/1987 | Okaniwa et al. |
| 4,746,838 A | 5/1988 | Kay |

(Continued)

FOREIGN PATENT DOCUMENTS

DE    10228186 A1    1/2004

(Continued)

OTHER PUBLICATIONS

Giersig, M. et al., Direct Observation of Chemical Reactions in Sillica-coated Gold and Silver Nanoparticles, Advanced Materials, vol. 9, No. 7, pp. 570-575, Jun. 1997, Wiley VCH, Weinheim, DE.

(Continued)

*Primary Examiner* — Jerry A Lorengo
*Assistant Examiner* — Noah Wiese

(57) ABSTRACT

The invention is to processes for producing a nanoglass powder batches and to powder batches formed by such processes. In one embodiment, the process comprises the steps of providing a precursor medium comprising a first metal oxide precursor to a first metal oxide, a second metal oxide precursor to a second metal oxide, and a liquid vehicle; and flame spraying the precursor medium under conditions effective to form aggregated nanoglass particles comprising the first and second metal oxides, wherein the aggregated nanoglass particles have an average primary particle size of from 25 nm to 500 nm. The aggregated nanoglass particles preferably have an average aggregate particle size of from 50 nm to 1000 nm and may be amorphous or crystalline.

22 Claims, 13 Drawing Sheets

U.S. PATENT DOCUMENTS

| | | | |
|---|---|---|---|
| 5,132,248 A | 7/1992 | Drummond et al. | |
| 5,628,945 A * | 5/1997 | Riman et al. | 264/117 |
| 5,661,041 A | 8/1997 | Kano | |
| 5,814,683 A | 9/1998 | Branham | |
| 5,882,722 A | 3/1999 | Kydd | |
| 6,080,928 A | 6/2000 | Nakagawa | |
| 6,159,267 A | 12/2000 | Hampden-Smith et al. | |
| 6,165,247 A | 12/2000 | Kodas et al. | |
| 6,184,457 B1 | 2/2001 | Tsuzuki et al. | |
| 6,268,014 B1 | 7/2001 | Eberspacher et al. | |
| 6,274,412 B1 | 8/2001 | Kydd et al. | |
| 6,277,169 B1 | 8/2001 | Hampden-Smith et al. | |
| 6,316,100 B1 | 11/2001 | Kodas et al. | |
| RE37,512 E | 1/2002 | Szlufcik et al. | |
| 6,338,809 B1 | 1/2002 | Hampden-Smith et al. | |
| 6,379,745 B1 | 4/2002 | Kydd et al. | |
| 6,413,790 B1 | 7/2002 | Duthaler et al. | |
| 6,506,438 B2 | 1/2003 | Duthaler et al. | |
| 6,582,763 B1 | 6/2003 | Nishimura et al. | |
| 6,697,694 B2 | 2/2004 | Mogensen | |
| 6,811,885 B1 | 11/2004 | Andriessen et al. | |
| 6,814,795 B2 | 11/2004 | McVicker et al. | |
| 6,951,666 B2 | 10/2005 | Kodas et al. | |
| 6,958,095 B2 | 10/2005 | Kakimoto et al. | |
| 7,115,218 B2 | 10/2006 | Kydd et al. | |
| 7,306,845 B2 * | 12/2007 | Horne et al. | 428/402 |
| 7,524,528 B2 | 4/2009 | Kodas et al. | |
| 7,533,361 B2 | 5/2009 | Edwards | |
| 7,553,512 B2 | 6/2009 | Kodas et al. | |
| 7,585,349 B2 | 9/2009 | Xia et al. | |
| 7,597,769 B2 | 10/2009 | Hampden-Smith et al. | |
| 7,625,420 B1 | 12/2009 | Kodas et al. | |
| 7,629,017 B2 | 12/2009 | Kodas et al. | |
| 2002/0146564 A1 | 10/2002 | Takai et al. | |
| 2002/0160685 A1 * | 10/2002 | Kodas et al. | 445/58 |
| 2003/0003231 A1 | 1/2003 | Kiguchi et al. | |
| 2003/0009726 A1 | 1/2003 | Chang et al. | |
| 2004/0046154 A1 | 3/2004 | McVicker et al. | |
| 2005/0217424 A1 | 10/2005 | Natan | |
| 2006/0083694 A1 | 4/2006 | Kodas et al. | |
| 2006/0162497 A1 * | 7/2006 | Kodas et al. | 75/363 |
| 2006/0166057 A1 | 7/2006 | Kodas et al. | |
| 2006/0189113 A1 | 8/2006 | Vanheusden et al. | |
| 2008/0145633 A1 | 6/2008 | Kodas et al. | |
| 2008/0318757 A1 | 12/2008 | Fotou et al. | |
| 2009/0053400 A1 | 2/2009 | la Vega et al. | |

FOREIGN PATENT DOCUMENTS

| | | |
|---|---|---|
| EP | 1244168 | 9/2002 |
| EP | 1300897 A1 | 4/2003 |
| EP | 1386708 A2 | 2/2004 |
| EP | 2270872 | 8/2006 |
| EP | 1801890 | 3/2010 |
| FR | 2862429 A1 | 5/2005 |
| JP | 2004235272 | 8/2004 |
| JP | 2006/210301 A | 8/2006 |
| WO | 9919900 | 4/1999 |
| WO | 0287749 | 11/2002 |
| WO | 03/016961 A2 | 2/2003 |
| WO | 2005/115936 A2 | 12/2005 |
| WO | 2006/076616 A2 | 7/2006 |
| WO | 2006/078825 A2 | 7/2006 |
| WO | 2006/078826 A2 | 7/2006 |
| WO | 2006/078827 A2 | 7/2006 |
| WO | 2007/053408 A2 | 5/2007 |
| WO | 2007053408 | 5/2007 |
| WO | 2007/149883 A1 | 12/2007 |
| WO | 2007149883 | 12/2007 |

OTHER PUBLICATIONS

Paichik, O. et al., Preparation and Characterization of Ni/NiO Composite Using Microwave Irradiation and Sonication, Nanostructured Materials, vol. 11, No. 3, pp. 415-420, May 1999, Elsevier, New York, US.

International Search Report and Written Opinion regarding International Patent Application No. PCT/US2008/067537, as mailed on Nov. 4, 2008.

Norton, D.P., "Synthesis and properties of epitaxial electronic oxide thin-film materials", Material Science and Engineering, Reports: A Review Journal, vol. 43, No. 5-6, Mar. 15, 2003, Elsevier Sequoia S.A., Lausanne, Switzerland.

Silvert et al., Preparation of Colloidal Silver Dispersions by the Polyol Process Part 2—Mechanism of Particle Formation, J. Mater. Chem., 1997, 7(2), 293-299.

Teng et al., Liquid Ink Jet Printing with MOD Inks for Hybrid Microcircuits, IEEE Transactions on Components, Hybrids, and Manufacturing Technology, vol. CHMT-12, No. 4, Dec. 1987 pp. 545-549.

Kwon et al., Viscosity of Magnetic Particle Suspension, Journal of Molecular Liquids, 75 (1998) pp. 115-126.

Palchik, et al., Preparation and Characterization of Ni/NiO Composite Using Microwave Irradiation and Sonication, NonStructured Material, (1995) vol. 11, No. 3, pp. 415-420.

* cited by examiner

NANOGLASS AND FLAME SPRAY PROCESSES FOR PRODUCING NANOGLASS

CROSS REFERENCE TO RELATED APPLICATIONS

This application is a continuation-in-part of U.S. patent application Ser. No. 11/765,313, entitled "PHOTOVOLTAIC CONDUCTIVE FEATURES AND PROCESSES FOR FORMING SAME," filed Jun. 19, 2007, the entirety of which is incorporated herein by reference.

BACKGROUND OF THE INVENTION

1. Field of Invention

The present invention relates to manufacturing nanoglass, and more particularly, manufacturing nanoglass in a flame spray reaction system.

2. Description of Related Art

There is currently a heightened interest in the use of nanoparticles for a variety of applications. However, nanoparticles may vary significantly in terms of size, particle size distribution, morphology or other physical properties. For example, nanoparticles may range in size from 1 nm to 500 nm, depending primarily upon the conditions employed for forming the nanoparticles. Larger sized nanoparticles may be desirable for some applications, while smaller sized nanoparticles may be desired for others. For example, in the case of nanoglass particles used in photovoltaic applications, larger particles may be desirable because they create a glass layer with greater porosity that allows gases to escape during the firing process. On the other hand, smaller particles or smaller aggregates may be desirable in other applications because such smaller particles allow more intimate mixing with the conductor and allow firing at lower temperatures and/or shorter times. Particle size may also be critical in colloidal stability of dispersions and in the thixotropic behavior of pastes produced from such particles. Additionally, for some applications spherical nanoparticles may be preferred over non-spherical nanoparticles. For other applications, it may be preferred to have nanoparticles that are agglomerated, or aggregated, into larger units of aggregates having a controlled structure. Also, for some applications, certain characteristics for other properties may be desired, such as the density or morphology of the nanoparticles.

Conventional processes for making nanoparticles have achieved some success in making nanoparticles having certain compositions and other properties. New processes are desired, however, that provide additional and commercially viable capabilities to satisfy a need for a broader range of nanoparticulate compositions and properties.

SUMMARY OF THE INVENTION

In a first embodiment, the invention is to a process for producing a nanoglass powder batch, wherein the process comprises the steps of providing a precursor medium comprising a first metal oxide precursor to a first metal oxide, a second metal oxide precursor to a second metal oxide, and a liquid vehicle; and flame spraying the precursor medium under conditions effective to form aggregated nanoglass particles comprising the first and second metal oxides, wherein the aggregated nanoglass particles have an average primary particle size of from 25 nm to 500 nm. The flame spraying preferably comprises the steps of: introducing the precursor medium into a flame reactor heated by at least one flame; transferring substantially all of the components through a gas phase of a flowing stream in the flame reactor; and growing aggregated nanoglass particles in the flowing stream, wherein the aggregated nanoglass particles comprise a mixture of the metal oxides. The average aggregate particle size preferably is from 50 nm to 1000 nm. Optionally, the nanoglass particles are substantially amorphous as determined by X-ray Diffraction. The flame preferably has a maximum temperature greater than 1000° C., e.g., optionally ranging from 1000° C. to 3000° C. In one aspect, the precursor medium resides in the flame from 10 to 500 milliseconds.

The metal oxide precursors that are employed may vary widely. In one embodiment, the first and second metal oxide precursors are independently selected from the group consisting of boric acid, alkyldisiloxanes, and nitrites, nitrate hydrates, and carboxylates of lithium, sodium, potassium, rubidium, cesium, beryllium, magnesium, calcium, strontium, barium, titanium, hafnium, vanadium, tantalum, molybdenum, tungsten, manganese, zinc, cadmium, boron, aluminum, gallium, indium, silicon, germanium, lead, phosphorus, antimony, and bismuth and/or wherein the first and second metal oxide precursors are non-volatile precursors. In a preferred embodiment, the first and second metal oxide precursors are selected from the group consisting of boric acid, bismuth nitrate pentahydrate, and hexamethyldisiloxane.

In a preferred aspect, each of the first and second metal oxide precursors decompose at a temperature within 25° C. to 1000° C. of each other. Optionally, each of the first and second metal oxide precursors contains a component for inclusion in the nanoglass particles, and greater than 90 percent by weight of the component of the first and second metal oxide precursors are converted to the metal oxide.

In another embodiment, the invention is to a nanoglass powder batch, comprising aggregated nanoglass particles. In this embodiment, each aggregated nanoglass particle comprises a plurality of primary nanoglass particles having an average primary particle size of from 25 nm to 500 nm. The aggregated nanoglass particles have an average aggregate particle size of from 50 nm to 1000 nm. The nanoglass preferably is substantially amorphous as determined by X-Ray Diffraction.

Preferably, at least 80 weight percent of the aggregated nanoglass particles are 1.25 to 3.0 times larger than the average primary particle size. The aggregated nanoglass particles preferably have a density of at least 80 percent of the theoretical density of the aggregated nanoglass particles.

The primary nanoglass particles of the powder batch preferably comprise a mixture of a plurality of metal oxides, the metal oxides being selected from the group consisting of $SiO_2$, $Al_2O_3$, $Bi_2O_3$, $B_2O_3$, $P_2O_5$, $GeO_2$, $ZnO$, $TiO_2$, $WO_3$, $MoO_3$, $V_2O_5$, $MnO$, $HfO_2$, $In_2O_3$, $Ga_2O_3$, $Ta_2O_5$, $Sb_2O_3$, $Sb_2O_5$, $CdO$, $PbO$, alkali oxides, and alkaline oxides.

In some preferred embodiments, the primary nanoglass particles of the powder batch comprise $Bi_2O_3$ in an amount ranging from 65.0 to 85.0 wt % based on the total weight of the primary nanoglass particles, and $B_2O_3$ in an amount ranging from 15.0 to 35.0 wt %, based on the total weight of the primary nanoglass particles. The primary nanoglass particles and/or the aggregated nanoglass particles preferably are substantially spherical.

BRIEF DESCRIPTION OF THE DRAWINGS

The foregoing and other objects and advantages of our invention will appear more fully from the following description, made in connection with the accompanying drawings of non-limiting preferred embodiments of the inventions, wherein like characters refer to the same or similar parts throughout the views, and in which.

DETAILED DESCRIPTION OF THE INVENTION

Figure 1:
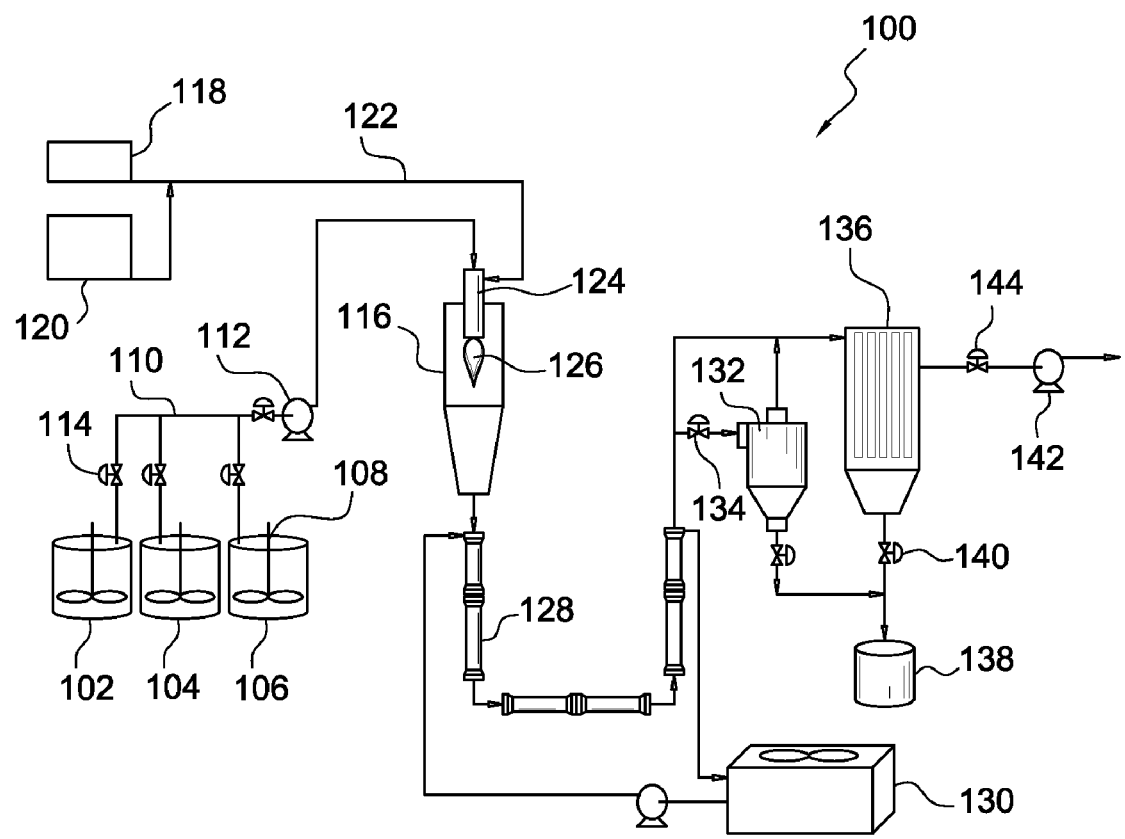
FIG. 1 is schematic diagram of a flame spray system constructed in accordance with one embodiment of the present invention.

In one aspect, the present invention is directed to a method of producing a nanoglass powder batch by providing a precursor medium and a liquid vehicle to a flame reactor system for flame spraying the precursor medium under conditions effective to form aggregated nanoglass particles. The precursor medium comprises a plurality of precursors to metal oxides. In one embodiment of the present invention, the precursor medium comprises at least two metal oxide precursors for two different metal oxides. The precursor medium may comprise, for example, from 2 to 20 metal oxide precursors, e.g., from 2 to 10 metal oxide precursors or from 2 to 5 metal oxide precursors. The metal oxides from such precursors form the aggregated nanoglass particles.

By "nanoglass particle," it is meant a particle comprising a mixture of at least two metal oxides, and having a primary particle size less than 500 nm as determined by X-ray spectroscopy. By "primary particles," it is meant identifiable particulate domains that are either substantially unaggregated, i.e., substantially unattached to each other or, if aggregated, nevertheless retain identifiable particulate attributes in that the particulate domains are joined together, for example, through necking between identifiable separate particulate domains. By "aggregated nanoglass particles," it is meant that two or more primary nanoglass particles are joined together. Thus, each of the primary particles in the aggregated nanoglass particles retains an identifiable domain. In one embodiment, the aggregated nanoglass particles have an average primary particle size of from 20 nm to 500 nm, e.g., from 25 nm to 500 nm, from 50 nm to 200 nm, or from 100 nm to 300 nm. In one embodiment, the aggregated nanoglass particles have an average aggregate particle size of from 50 nm to 1000 nm, e.g., from 50 nm to 500 nm or from 100 nm to 1000 nm. The aggregated nanoglass particles in the powder batch preferably are substantially uniform such that at least 80 wt %, e.g., at least 90 wt %, at least 95 wt % or at least 99 wt %, of the aggregated nanoglass particles are 1.25 to 3.0 times, e.g., from 1.5 to 2.5 times or from 1.8 to 2.2 times, larger than the average primary particle size.

As will be appreciated, when the nanoglass particles are in the form of aggregates, the aggregate units will be of a larger size than the primary nanoglass particles. For example, the aggregates may have an average aggregate particle size greater than 1.5 times, e.g., greater than 2 times, greater than 3 times, greater than 5 times or greater than 10 times, the average primary particle size. Such aggregate units may include only two primary nanoglass particles or may comprise dozens or even hundreds or more primary nanoglass particles.

Although generally less desired, aggregates of primary particles, under some process conditions (e.g., cooler flames and longer residence times), may themselves aggregate to form "agglomerated nanoglass particles." These agglomerated nanoglass particles are held together by physical forces that are weaker in comparison to the physical forces that bind the primary particles in an aggregate. Depending on conditions, agglomerated nanoglass particles having an average agglomerate particle size of from 1 μm to 10 μm, e.g., from 1 μm to 5 μm, may be formed. In some embodiments of the invention, the nanoglass primary particles are substantially unagglomerated, while in other embodiments the nanoglass primary particles may be in the form of agglomerates. The agglomerates may be hard agglomerates, meaning that the agglomerates are not easy to break apart to release the individual nanoglass particles and/or individual nanoglass aggregates, or soft agglomerates meaning that the agglomerates are easy to break apart to release the individual nanoglass particles and/or individual nanoglass aggregates, e.g., through agitation.

As will be appreciated, when the nanoglass particles are in the form of agglomerates, the agglomerate units will be of a larger size than the unagglomerated nanoglass particles and a larger size than the aggregated nanoglass particles. For example, the agglomerates may have an average agglomerate particle size greater than 1.5 times, e.g., greater than 2 times, greater than 3 times, greater than 5 times or greater than 10 times, the average aggregate particle size. Such agglomerate units may include only two nanoglass aggregate particles or may comprise dozens or even hundreds or more nanoglass aggregate particles. In most, but not all embodiments, it is preferred that the nanoglass particles made according to methods of the invention are either substantially unagglomerated or in the form of soft agglomerates that are easily broken up.

The metal oxides in the nanoglass particles may vary widely. A non-limiting list of exemplary metal oxides suitable for nanoglass powder batches may include the following oxides: $SiO_2$, $Al_2O_3$, $Bi_2O_3$, $B_2O_3$, $P_2O_5$, $GeO_2$, $ZnO$, $TiO_2$, $WO_3$, $MoO_3$, $V_2O_5$, $MnO$, $HfO_2$, $In_2O_3$, $Ga_2O_3$, $Ta_2O_5$, $Sb_2O_3$, $Sb_2O_5$, $PbO$, $Pb_3O_4$, $CdO$, one or more alkali oxides (e.g., oxides of Li, Na, K, Rb or Cs), alkaline oxides (e.g., oxides of Mg, Ca, Sr or Ba), and various mixtures thereof. In several preferred embodiment, the nanoglass powder batches comprise nanoglass particles comprise one or more of the following metal oxides: $SiO_2$, $Al_2O_3$, $Bi_2O_3$, $B_2O_3$, $ZnO$, $PbO$, $Pb_3O_4$, $CdO$, and various mixtures thereof. In one embodiment, the aggregated nanoglass particles comprise $Bi_2O_3$ and at least one other oxide.

In some embodiments, the nanoglass particles comprise lead, typically in the form of lead oxide. The presence of lead oxide in the nanoglass particles may be particularly desirable for etching applications, for example, for etching silicon nitride antireflective layers during the manufacture of photovoltaic cells.

In other embodiments, the nanoglass particles do not contain any lead or are substantially lead free. In one embodiment, the aggregated nanoglass particles do not contain any cadmium or are substantially cadmium free. In another embodiment, the aggregated nanoglass particles do not contain any lead or cadmium or are substantially free of lead and cadmium.

In one embodiment, the aggregated nanoglass particles comprise one or more metal oxides shown in Table 1. Any weight percent from the three ranges, including sub-ranges thereof, for a metal oxide provided in Table 1 may be used in combination with another metal oxide. Unless stated otherwise, all weight percents are based on the total mass of the aggregated nanoglass particles.

TABLE 1

| Metal Oxide | First Wt % | Second Wt % | Third Wt % |
|---|---|---|---|
| $Bi_2O_3$ | 50.0-95.0 | 60.0-95.0 | 70.0-95.0 |
| $B_2O_3$ | 2.5-50.0 | 2.5-25.0 | 5.0-10.0 |
| $SiO_2$ | 0.0-25.0 | 1.5-15.0 | 1.5-10 |
| $Al_2O_3$ | 0.0-25.0 | 0.0-15.0 | 1.5-10 |
| $P_2O_5$ | 0.0-25.0 | 0.0-15.0 | 1.5-10 |
| $GeO_2$ | 0.0-25.0 | 0.0-15.0 | 1.5-10 |
| $ZnO$ | 0.0-25.0 | 1.5-25.0 | 1.5-10 |
| $TiO_2$ | 0.0-25.0 | 0.0-15.0 | 1.5-10 |
| $WO_3$ | 0.0-25.0 | 0.0-15.0 | 1.5-10 |
| $MoO_3$ | 0.0-25.0 | 0.0-15.0 | 1.5-10 |
| $V_2O_5$ | 0.0-25.0 | 0.0-15.0 | 1.5-10 |
| $HfO_2$ | 0.0-25.0 | 0.0-15.0 | 1.5-10 |
| $In_2O_3$ | 0.0-25.0 | 0.0-15.0 | 1.5-10 |
| $Ga_2O_3$ | 0.0-25.0 | 0.0-15.0 | 1.5-10 |
| $Ta_2O_5$ | 0.0-25.0 | 0.0-15.0 | 1.5-10 |
| $Sb_2O_3$ or $Sb_2O_5$ | 0.0-25.0 | 0.0-15.0 | 1.5-10 |
| $PbO$ or $Pb_3O_4$ | 0.0-25.0 | 0.0-15.0 | 1.5-10 |
| $CdO$ | 0.0-25.0 | 0.0-15.0 | 1.5-10 |
| $SnO$ | 0.0-25.0 | 0.0-15.0 | 1.5-10 |
| Alkali oxides | 0.0-25.0 | 0.0-15.0 | 1.5-10 |
| Alkaline oxides | 0.0-25.0 | 0.0-15.0 | 1.5-10 |

In some preferred embodiments, particularly for etching (e.g., etching $SiN_x$ antireflective layers) in photovoltaic applications, the nanoglass comprises two or more metal oxides selected from NiO, $Ni_2O_3$, $Bi_2O_3$, $B_2O_3$, ZnO, $SiO_2$, SrO and PbO. The nanoglass optionally comprises a major metal oxide, i.e., a metal oxide in an amount greater than 50 wt. %. Exemplary major metal oxides include $Bi_2O_3$ and PbO. In one aspect, the first metal oxide comprises PbO, and the second metal oxide comprises silica. In this embodiment, the nanoglass preferably comprises the first metal oxide in an amount greater than 50 wt. %, or about 60 wt. %, and preferably comprises the second metal oxide in an amount greater than 30 wt. %, e.g., about 40 wt. %. In another aspect, the first metal oxide comprises $Bi_2O_3$ and the second metal oxide comprises $B_2O_3$. In this embodiment, the nanoglass preferably comprises the first metal oxide in an amount greater than 50 wt. %, e.g., greater than 60 wt. % or greater than 70 wt. %. Additional metal oxides also may be included in this nanoglass composition. For example, in a non-limiting preferred embodiment, the nanoglass comprises the following components (optional weight percentages are in parenthesis): $Bi_2O_3$ (~80 wt. %), $B_2O_3$ (~5 wt. %), ZnO (~5 wt. %), $SiO_2$ (~5 wt. %) and SrO (~5 wt. %). In another non-limiting preferred embodiment, the nanoglass comprises $Bi_2O_3$ (~55 wt. %), $B_2O_3$ (~23 wt. %), and ZnO (~22 wt. %). In another embodiment the aggregated nanoglass particles comprise 70.0-95.0 wt. % $Bi_2O_3$, 2.5-15.0 wt. % $B_2O_3$, and 2.5-15.0 wt. % $SiO_2$. In another embodiment the aggregated nanoglass particles comprise 50.0-70.0 wt. % of $Bi_2O_3$, 15.0-25.0 wt. % of $B_2O_3$, and 15.0-25.0 wt. % of ZnO. In another embodiment the aggregated nanoglass particles comprise 60.0-80.0 wt. % of $Bi_2O_3$, 5.0-10.0 wt. % of $B_2O_3$, 1.5-10.0 wt. % of $SiO_2$, 1.5-10.0 wt. % of ZnO, and 1.5-10.0 wt. % of SrO. In another embodiment the aggregated nanoglass particles comprise 65.0-85.0 wt. % of $Bi_2O_3$, and 15.0-35.0 wt. % of $B_2O_3$. Such aggregated nanoglass particles may be substantially free from any other metal oxides.

The metal oxides suitable for use with the present invention may be derived, for example, from precursors selected from the group consisting of boric acid, alkyldisiloxanes, and nitrites, nitrate hydrates and carboxylates of lithium, sodium, potassium, rubidium, cesium, beryllium, magnesium, calcium, strontium, barium, titanium, hafnium, vanadium, tantalum, molybdenum, tungsten, manganese, zinc, cadmium, boron, aluminum, gallium, indium, silicon, germanium, lead, phosphorus, antimony, and bismuth. $Bi_2O_3$ may be formed from a bismuth nitrate pentahydrate. $B_2O_3$ may be formed from a boric acid precursor. $SiO_2$ may be formed from a hexamethyldisiloxane precursor.

In one embodiment, the precursors in the precursor medium are non-volatile precursors, i.e., precursors having a vapor pressure at 100° C. less than 0.2 kPa, e.g., less than 0.1 kPa, less than 0.05 kPa or less than 0.01 kPa. Using non-volatile precursors in a flame spray process (FSP) expands the number of metal oxides that may be incorporated into the nanoglass powder batch of the present invention. Non-flame spray processes typically employ precursors having higher vapor pressures and lower boiling points such as, for example, $SiCl_4$, $TiCl_4$, $Al_2Cl_6$ and $ZrCl_4$ and thus are limited in the types of metal oxides that can be used.

In some embodiments, the precursors in the precursor medium decompose at a temperature within 25° C. to 1000° C. of each other, e.g., 25° C. to 800° C. or 25° C. to 500° C. In some embodiments the precursors may decompose at substantially the same temperature, e.g., within 50° C. of one another, within 25° C. of one another or within 10° C. of one another. One advantage of using precursors with similar decomposition temperatures is the FSP will separate the precursors and form nanoglass particles at approximately the same rate thereby facilitating the formation of a substantially homogenous mixture of metal oxides within the resulting nanoglass particles.

In one embodiment the precursor medium may be nongaseous. By "nongaseous," it is meant that the precursor medium is not in a vapor state. As introduced into the flame reactor, the nongaseous precursor medium will be, or be part of, one or more of a liquid, a solid or a supercritical fluid. For example, the precursor medium may be contained in a liquid phase, solid phase or supercritical fluid phase of feed to the flame reactor. In one embodiment, precursor medium is contained within a nongaseous disperse material, such as in disperse droplets or aerosol of droplets. For example, the precursor medium may be contained in droplets of liquid sprayed into the flame or into a hot zone in the internal reactor volume. In one embodiment, the precursor medium will be in a disperse phase of a flowing feed stream, in which the disperse phase is dispersed in a gas phase when introduced into the flame reactor. In yet another embodiment, the precursor medium may be dissolved in a supercritical fluid that is introduced into the flame reactor. As the supercritical fluid expands upon introduction into the flame reactor, typically to a gaseous state, the capacity of the fluid as a solvent is reduced and the precursor medium precipitates. A preferred supercritial fluid is carbon dioxide although other supercritical fluids could be used instead.

The precursor medium includes at least two components for inclusion in the aggregated nanoglass particles. By "component" it is meant at least some identifiable portion of the precursor medium that becomes a part of the aggregated nanoglass particles. For example, the component could be the entire composition of the precursor medium when that entire composition is included in the aggregated nanoglass particles. More often, however, the component will be something less than the entire composition of the precursor medium, and may be only a constituent element present in both the composition of the precursor medium and the aggregated nanoglass particles. For example, it is often the case that in the flame reactor the precursor medium decomposes, and one or more elements in a decomposition product then becomes part of the aggregated nanoglass particles, either with or without further reaction of the decomposition product. For example, a precursor medium comprising a bismuth nitrate pentahydrate ($Bi(NO_3)_3 \cdot 5H_2O$) precursor decomposes such that bismuth becomes part of the aggregated nanoglass particles as an oxide, namely $Bi_2O_3$.

In one preferred embodiment, the nanoglass primary particles made according to the processes of the present invention are spheroidal. By the term "spheroidal" it is meant a shape that is either spherical or resembles a sphere even if not perfectly spherical. For example such spheroidal primary particles, although of rounded form, may be elongated or oblong in shape relative to a true sphere. As another example, such spheroidal primary particles may have faceted or irregular surfaces other than the rounded surfaces of a sphere. Also, the primary particles may have significant internal porosity or may be very dense, with particles of higher density generally being preferred. In one implementation, the nanoglass primary particles have a density of at least 80 percent, e.g. at least 85 percent or at least 90 percent, of theoretical density for the composition of the nanoglass primary particles, as measured by helium pycnometry. In some applications, however, it may be desirable to have a very large specific surface area and the nanoglass primary particles may include a significant amount of porosity.

Embodiments of the present invention use FSP and FSP systems such as those described by U.S. Ser. No. 11,335,727, filed on Jan. 20, 2006, U.S. Ser. No. 11/335,729, filed on Jan. 20, 2006, U.S. Ser. No. 11/335,726, filed on Jan. 20, 2006, and U.S. Ser. No. 11/765,313, filed on Jun. 19, 2007, the entire contents and disclosure of which are hereby incorporated by reference. FSP offers great flexibility in terms of particle composition. Fairly complex particles can be produced by mixing chemically compatible precursors and by spraying those precursors into the flame. Since FSP is a high temperature process, it typically does not require post-processing of the particles to alter the particle phase composition. Nevertheless, if post-processing is required to change for example the oxidation state of the materials, this can be done without significant loss of surface area since the FSP-made materials are more thermally stable compared to materials produced by liquid phase chemistry. Contrary to conventional spray pyrolysis, FSP enables production of submicron particles at reasonably high throughput because FSP does not require substantial dilution of the precursor solution in order to achieve particle sizes in the nanometer range. Moreover, the use of liquid fuels as solvents avoids the problem of hollow particle formation, a common nuisance in conventional spray pyrolysis, since heat transfer is extremely fast and inhibits the precursor from selectively reacting on the droplet surface. Some other obvious advantages of FSP compared to conventional processes for making high surface materials are that FSP requires relatively small amounts of solvents, produces high purity materials and FSP is a simple, easy to scale process.

An exemplary flame spray system 100 is shown in non-limiting FIG. 1. In FIG. 1, there is shown a first precursor container 102 that holds a first precursor and a second precursor container 104 that holds a second precursor. In addition there is a liquid vehicle container 106 that holds a liquid vehicle such as a solvent. Suitable solvents include, but are not limited to, alcohols, diols and mixtures thereof. Liquid vehicle container 106 is optional as the liquid vehicle may be included in first and second precursor containers 102, 104. Of course, additional containers may be employed, for example, if additional precursors are desired. Each of the containers has a mixer 108 and a respective conduit 110 which are interconnected to pump 112. Valves 114 regulate the flow of the precursors and liquid vehicle. As the precursors and liquid vehicle travel toward the pump, the materials mix to form a precursor medium. Pump 112 feeds the precursor medium to the flame reactor 116. An oxidizer, such as air or $O_2$, 118 and a gaseous fuel 120 are fed to flame reactor 116 via a separate conduit 122.

Flame reactor 116 comprising a burner 124 which receives the precursor medium, oxidizer 118 and gaseous fuel 120 generates a flame 126. In the flame 126 the metal components in the precursor medium form metal oxides which in turn form aggregated nanoglass particles. The flowing stream of aggregated nanoglass particles is cooled in a heat exchanger 128. In one embodiment, the heat exchanger is a jacketed tube, e.g., pipe. The tube allows a cooling medium, e.g., water or chilled water, to cool the particle-laden gas. As an example, the pipe is surrounded by a jacket (not shown). The jacket allows the cooling medium to flow around the pipe, thereby cooling the particle-laden gas stream that is flowing through the pipe. As shown in FIG. 1, a chiller 130 supplies the cooling medium to conduits, e.g., pipes, in order to cool or to further cool the flowing streaming. Next, a portion of the flowing stream is directed to separation device 132 (a cyclone separator is shown, however other devices may include electrostatic precipitators, filters, and thermoplastic sampling devices, among others) when valve 134 is open. Separation device 132 separates the resulting nanoglass particles from the gas phase. In one embodiment, separation device 132 is used to collect an inline sample from the stream. In another embodiment, the majority of the powder is not collected in the separation device 132. Nanoglass particles that are entrained in the gas phase from separation device 132 are directed to a baghouse filter 136 where an additional separation is made. In one embodiment, the majority of the particle-gas separation occurs in the baghouse filter 136. The nanoglass particles from separation device 132 and baghouse filter 136 are directed to a particle collection container 138. Valves 140 regulate the flow of nanoglass into container 138. A pump 142 may be used to vent baghouse filter 136 when valve 144 is opened.

In another embodiment, the particle-laden gas stream is cooled by direct injection of a cooling medium, e.g., water or chilled water. The cooling medium may be in the form of fine spray and may be injected into the heat exchanger. In this case, cooling can occur by the heat being transferred from the gas to the water droplets thereby evaporating the water. As an example, various atomizer types that can be used for this purpose include, but are not limited to, air-assist nozzles, pressurized nozzles and ultrasonic nozzles, as well as venturi-type injectors. In various other embodiments, the location of the water injection varies.

Although several devices are shown as part of the exemplary flame spray system 100 in FIG. 1, additional devices, filters, pipes, valves, etc. may be added without changing the scope of the present invention.

Figure 2:
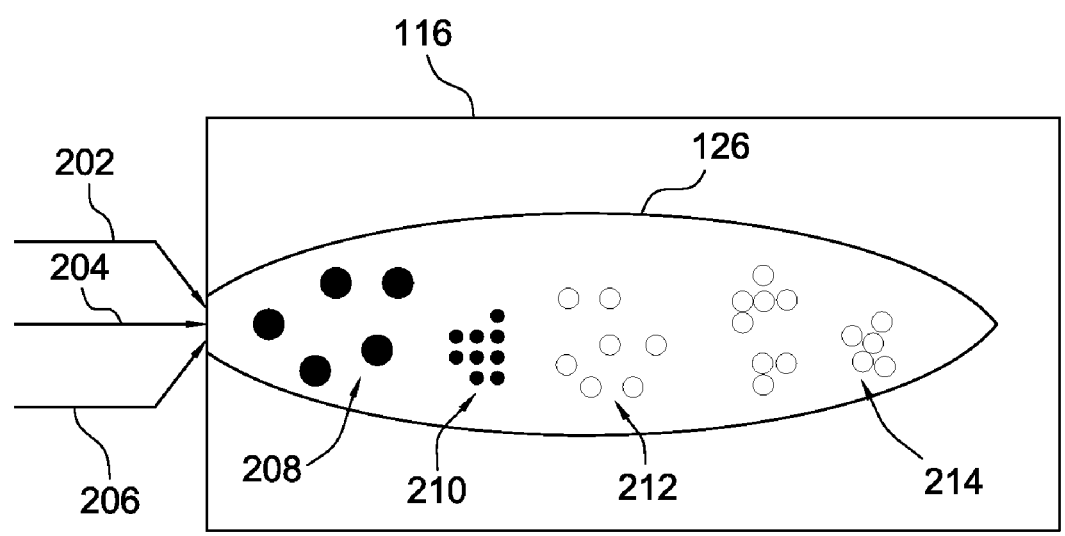
FIG. 2 is cross-section view of a flame in accordance with one embodiment of the present invention.

FIG. 2 illustrates a detailed view of the flame 126 in the flame reactor 116 shown in FIG. 1. The precursor medium 202, fuel 204, and oxidizer 206 are fed into the flame 126. Although not shown in FIG. 2, the precursor medium 202, fuel 204, and oxidizer 206 may be fed to the burner 124 as shown in FIG. 1. There are four stages of the components in the flame 126: droplet evaporation 208, nucleation 210, coagulation sintering 212 and aggregation 214. It should be understood that the particles flow in a stream and pass through these stages in flame 126. The flow of the stream continues until the aggregated nanoglass particles are collected. These stages are described further detail in conjunction with the various embodied methods to form nanoglass particles shown in FIGS. 3A-3D and various embodied flame reactors in FIGS. 4A-4D.

Figure 3A:
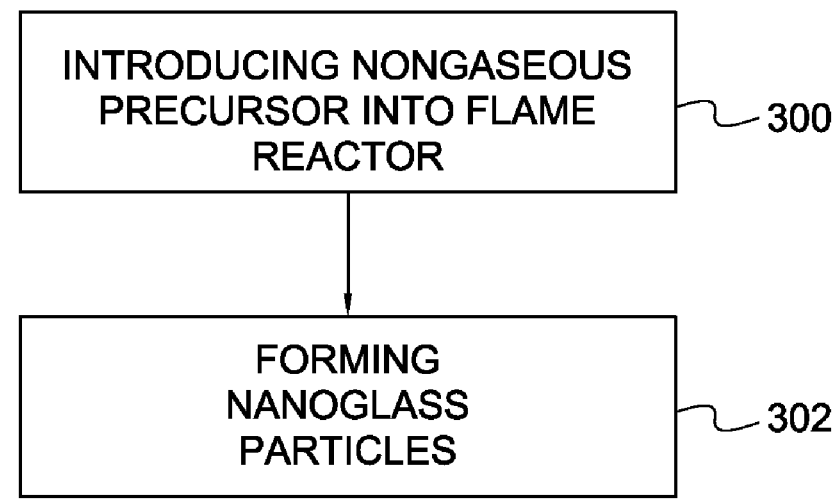
FIG. 3A is a generalized process block-diagram of one embodiment of the method of the present invention for forming nanoglass particles.

FIG. 3A shows a generalized process-block diagram of a general embodiment of a method of making nanoglass particles according to the present invention. FIGS. 3B-3F show additional and/or optional processes that may be combined with the generalized process-block diagram of FIG. 3A in various embodiments of the present invention. Additional embodiments may combine one or more of these processes, such as the forming process of FIGS. 3B-3D with the pre-introducing processes of FIG. 3E or 3F.

As shown in FIG. 3A, the method includes introducing 300 into a flame reactor the precursor medium followed by forming 302 the nanoglass particles. By a flame reactor, it is meant a reactor having an internal reactor volume directly heated by one or more than one flame when the reactor is operated. By directly heated, it is meant that the hot discharge of a flame flows into the internal reactor volume. By the term flame, it is meant a luminous combustion zone. In one embodiment the flame has a maximum temperature greater than 1000° C., e.g., greater than 1500° C. or greater than 2000° C. In terms of ranges the maximum temperature of the flame is from 1000° C. to 3000° C., e.g., from 1000° C. to 1500° C., from 1000° C. to 2000° C., or from 1500° C. to 3000° C.

Figure 4A:
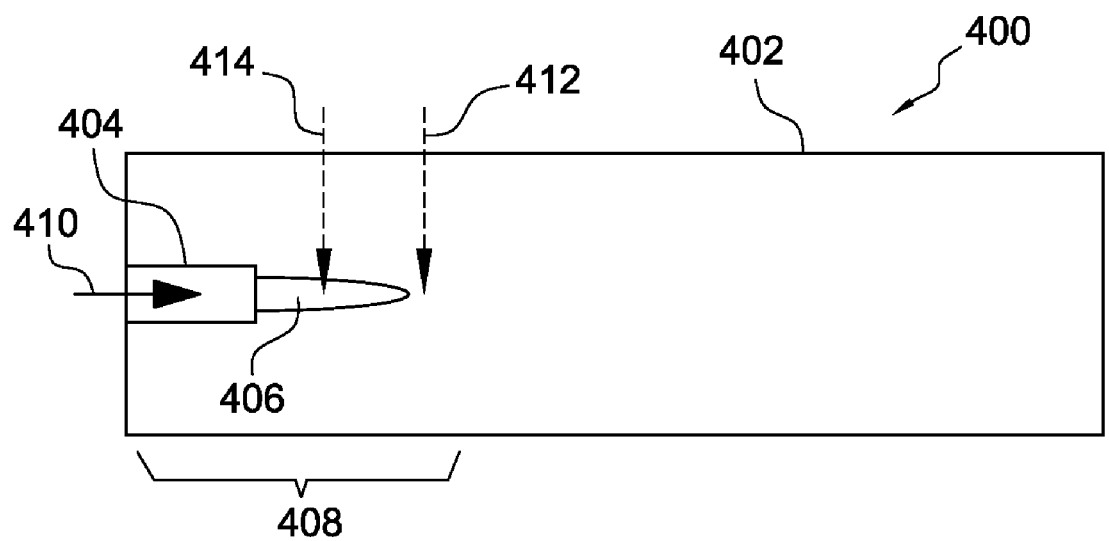
FIG. 4A is a side view of a flame reactor having a primary zone that may be used to implement one embodiment of the method of the present invention.
Figure 4B:
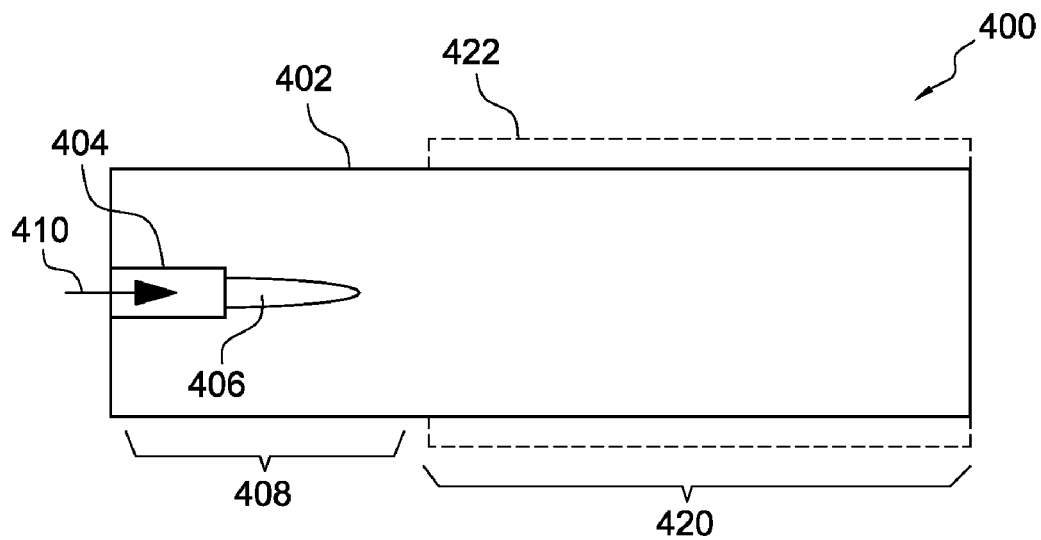
FIG. 4B is a side view of a flame reactor having a secondary zone that may be used to implement one embodiment of the method of the present invention.

Turning now to the flame reactor 116 of FIG. 1, FIGS. 4A-4B illustrates various embodiments that may be used in carrying out methods in accordance with the present invention. FIG. 4A is a cross-sectional view of a flame reactor 400 that comprises a tubular conduit 402 of a circular cross-section, a burner 404, and a flame 406 generated by the burner 404. In the embodiment of FIG. 4A, flame 406 is disposed within tubular conduit 402. Flame reactor 400 has a very hot primary zone 408 that includes the flame 406 and the internal reactor volume within the immediate vicinity of the flame 406. Also, shown in FIG. 4A, feed 410 including the precursor medium is introduced directly into the flame 406 through the burner 404. Fuel and oxidant for the flame 406 may be fed to the flame 406 as part of and/or separate from the feed 410 of the precursor medium. Optionally, the feed of the precursor medium 410 may be introduced into flame 406 shown by arrow 412 or at a location adjacent to, but just beyond the end of the flame 406 shown by arrow 414. Additional multiple feeds of precursor may be introduced into the flame reactor 400, with different feeds being introduced simultaneously at different locations. This embodiment may be particularly desired if the different precursors employed have differing vapor pressures in order to ensure that the formation of the desired metal oxides occurs at substantially the same time.

Although one burner 404 is shown in FIG. 4A, in other embodiments feed 410 may be divided and fed to multiple burners. The number of additional burners may range from 2 to 20, e.g., from 2 to 10, or from 2 to 6. The additional burners may be arranged in a circular pattern. In some embodiments additional burners may increase the production rates.

Although a flame reactor for use with the processes of the present invention may include any burner that is suitable for heating a flame reactor, multi-channel burners are preferred for many implementations of the method of the present invention. By the term "multi-channel burner" it is meant a burner with at least two channels or flow paths where different feeds that may include a precursor medium, an oxidant, a fuel and other materials are introduced into the burner. As a nonlimiting example, multi-channel burners allow an oxidant, a fuel and a precursor material to all be segregated and fed into different channels of a burner. As another nonlimiting example, every channel of a multi-channel burner may receive the same feed, which may be a combination of fuel, oxidant and/or precursor. Multi-channel burners have several advantages over a single channel burner based on the ability to feed different combinations of materials into separate channels. One major advantage is the ability to control the characteristics (e.g., shape, temperature and temperature profile) of the flame by changing the composition of feeds and the channels into which the feeds are introduced. Control over the characteristics of the flame also allows the properties of nanoglass particles formed within the flame to be controlled. For example, controlling the temperature of the flame may allow control over the crystallinity of materials included in the nanoglass particles. Additionally, a uniform temperature profile throughout a flame will generate particles with uniform properties regardless of whether formed at the center of the flame or whether formed near an edge of the flame.

With reference to FIGS. 3A and 4A, the following is a description of how the method may be performed using the flame reactor 400. During the introducing process 300 in FIG. 3A, precursor medium feed 410 is introduced into primary zone 408, preferably through burner 404. An oxidant and a fuel are also fed through burner 404 for combustion to maintain the flame 406. The oxidant and/or fuel may be fed to the burner 404 together with or separate from the feed of the precursor medium 410. During the forming process 302 of FIG. 3A, the temperature attained in the primary zone 408, such as in the flame 406, is sufficiently high so that substantially all material of the components in the precursor medium is transferred through the gas phase, and nucleation then at least begins in primary zone 408.

Figure 3B:
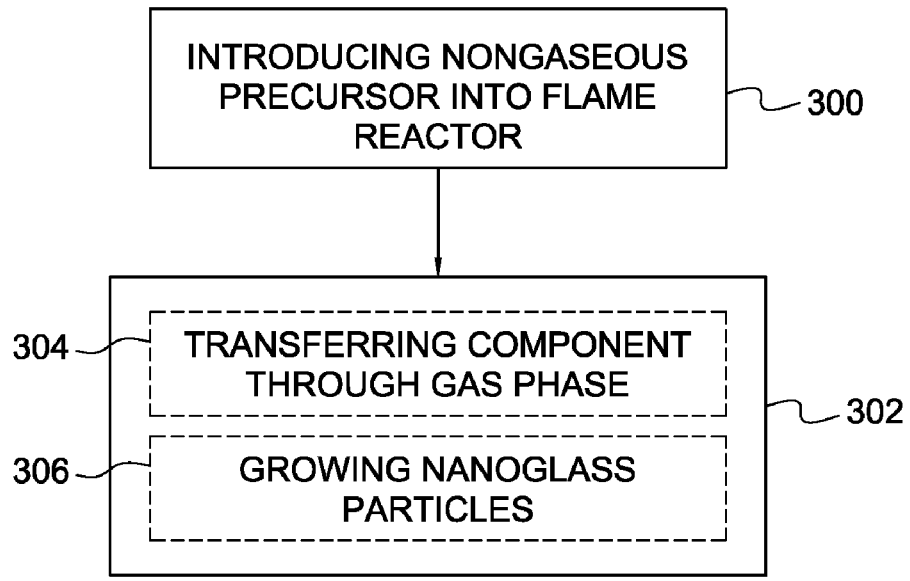
FIG. 3B is a generalized process block-diagram of one embodiment of the method of the present invention for forming nanoglass particles that includes transferring a component into a gas phase and growing nanoglass particles.

With reference now to FIG. 3B, a generalized process-block diagram is shown of one embodiment of the method of the present invention. As in FIG. 3A, the process includes the steps of introducing 300 the precursor medium into the flame reactor and the forming 302 of nanoglass particles. In FIG. 3B, the forming 302 is shown to include both transferring 304 of the component from the precursor medium through the gas phase and growing 306 the nanoglass particles to attain the desired size.

During the transferring 304, the precursor component (e.g., metal-containing compound) contained in the precursor medium, and typically all other material of the precursor medium, enter the gas phase in a vapor form. The transfer into the gas phase is driven by the high temperature in the flame reactor in the vicinity of where the precursor medium is introduced during the introducing 300. This may occur by any mechanism including simple vaporization of the precursor medium or thermal decomposition or other reaction involving the precursor medium. The transferring 304 also includes removing the precursor component from the gas phase, to permit inclusion in the nanoglass particles. Removal of the precursor component from the gas phase may likewise involve a variety of mechanisms, including simple condensation as the temperature of the flowing stream drops, precipitation due to high concentration in the gas phase, or a reaction producing a reaction to a non-volatile reaction product. Also, it is noted that transfer into and out of the gas phase are not necessarily distinct steps, but may be occurring simultaneously, so that some of the precursor component may still be transferring into the gas phase where other component(s) are already transferring out of the gas phase. Regardless of mechanism, however, substantially the entire precursor component from the precursor medium is transferred through the gas phase during the transferring 304. In one embodiment, about 90%, e.g. 95% or 99%, by weight of the precursor component in the precursors are converted to the oxide of the component during the FSP.

Also, substantially all material in a feed stream of the precursor medium should in one way or another be transferred into the gas phase during the transferring 304. For example, one common situation is for the feed to include droplets in which the precursor medium is dissolved when introduced into the flame reactor. In this situation, liquid in the droplet must be removed as well. The liquid may simply be vaporized to the gas phase, which would typically be the case for water. Also, some or all of the liquid may be reacted to vapor phase products. As one example, when the liquid contains fuel or oxidant that is consumed by combustion in a flame in the reactor, likewise, any solid fuel or oxidant in the feed would also be consumed and converted to gaseous combustion products.

As noted previously, the flame reactor includes one or more than one flame that directly heats an interior reactor volume. Each flame of the flame reactor will typically be generated by a burner, through which oxidant and the fuel are fed to the flame for combustion. The burner may be of any suitable design for use in generating a flame, although the geometry and other properties of the flame will be influenced by the burner design. Some exemplary burner designs that may be used to generate a flame for the flame reactor are discussed below. Each flame of the flame reactor may be oriented in any desired way. Some nonlimiting examples of orientations for the flame include horizontally extending, vertically extending (flame may be directed in an upward or downward direction) or extending at some intermediate angle between vertical and horizontal. When the flame reactor has a plurality of flames, some or all of the flames may have the same or different orientations.

Each flame has a variety of properties (e.g., flame geometry, temperature profile, flame uniformity, flame stability), which are influenced by factors such as the burner design, properties of feeds to the burner, and the geometry of the enclosure in which the flame is situated.

One important aspect of a flame is its geometry, or the shape of the flame. Some geometries tend to provide more uniform flame characteristics, which promotes manufacture of the nanoglass particles with relatively uniform properties. One geometric parameter of the flame is its cross-sectional shape at the base of the flame perpendicular to the direction of flow through the flame. This cross-sectional shape is largely influenced by the burner design, although the shape may also be influenced by other factors, such as the geometry of the enclosure and fluid flows in and around the flame. Other geometric parameters include the length and width characteristics of the flame. In this context the flame length refers to the longest dimension of the flame longitudinally in the direction of flow and flame width refers to the longest dimension across the flame perpendicular to the direction of flow. With respect to flame length and width, a wider, larger area flame, has potential for more uniform temperatures across the flame, because edge effects at the perimeter of the flame are reduced relative to the total area of the flame.

Discharge from each flame of the flame reactor flows through flow path, or the interior pathway of a conduit, through the flame reactor. As used herein, "conduit" refers to a confined passage for conveyance of fluid through the flame reactor. When the flame reactor comprises multiple flames, discharge from any given flame may flow into a separate conduit for that flame or a common conduit for discharge from more than one of the flames. Ultimately, however, streams flowing from each of the flames generally combine in a single conduit prior to discharge from the flame reactor.

The conduit that defines the flame reactor may have a variety of cross-sectional shapes and areas available for fluid flow, with some nonlimiting examples including circular, elliptical, square or rectangular. In most instances, however, conduits having circular cross-section are preferred. The presence of sharp corners or angles may create unwanted currents or flow disturbances that can aggregate deposition on conduit surfaces. Walls of the conduit may be made of any material suitable to withstand the temperature and pressure conditions within the flame reactor. The nature of the fluids flowing through the flame reactor may also affect the choice of materials of construction used at any location within the flame reactor. Temperature, however, may be the most important variable affecting the choice of conduit wall material. For example, quartz may be a suitable material for temperatures up to about 1200° C. As another example, for temperatures up to about 1500° C., possible materials for the conduit include refractory materials such as alumina, mullite or silicon carbide might be used. As yet another example, for processing temperatures up to about 1700° C., graphite or graphitized ceramic might be used for conduit material. As another example, if the flame reactor will be at moderately high temperatures, but will be subjected to highly corrosive fluids, the conduit may be made of a stainless steel material. These are merely some illustrative examples. The wall material for any conduit portion through any position of the flame reactor may be made from any suitable material for the processing conditions.

The precursor medium is introduced into the flame reactor in a very hot zone, also referred to herein as a primary zone, that is sufficiently hot to cause the component of the precursor medium for inclusion in the nanoglass particles to be transferred through the gas phase of a flowing stream in the flame reactor, followed by a particle nucleation from the gas phase. Typically the temperature in at least some portion of this primary zone, and sometimes only in the hottest part of the flame, is high enough so that substantially all of materials flowing through that portion of the primary zone is in the gas phase. The component of the precursor medium may enter the gas phase by any mechanism. For example, the precursor medium may simply vaporize, or the precursor medium may decompose and the precursor component enters the gas phase as part of a decomposition product. Eventually, however, the component leaves the gas phase as particle nucleation and growth occurs. Removal of the component from the gas phase may involve simple condensation as the temperature cools or may include additional reactions involving the component that results in a non-vapor reaction product. In addition to this primary zone where the component of the precursor medium is transferred into the gas phase, the flame reactor may also include one or more subsequent zones for growth or modification of the nanoglass particles. In most instances, the primary zone will be the hottest portion within the flame reactor.

Referring again to FIG. 3B, in addition to the transferring 304, the forming 302 also includes the growing 306 nanoglass particles. During the growing 306, the nanoglass particles are controllably grown to increase the weight average aggregated nanoglass particle size into a desired weight average particle size range, which will depend upon the particular composition of the nanoglass particles and the particular application for which the nanoglass particles are being made.

The growing commences with particle nucleation and continues until the nanoglass particles attain a weight average aggregated nanoglass particle size within a desired range. When making extremely small particles, the growing 306 may mostly or entirely occur within the primary zone of the flame reactor immediately after the flame. However, when larger aggregates or agglomerates are desired, processing may be required in addition to that occurring in the primary zone of the flame reactor. As used herein, "growing" the nanoglass particles refers to increasing the weight average aggregated nanoglass particle size. Such growth may occur due to collision and aggregation of primary particles into larger particles or through addition of additional material into the flame reactor for addition to the growing nanoglass particles. The growth of the nanoglass particles may involve added material of the same type as that already present in the nanoglass particles or addition of a different material.

As noted, in some embodiments an important contribution to the growing 306 is due to collisions between similar particles and aggregation of the colliding particles to form larger nanoglass aggregates. The aggregation must be sufficiently complete that the colliding particles fuse together to form a new larger aggregate particle, with the prior primary particles of the colliding particles no longer being present, although they are still identifiable domains within the aggregate nanoglass particles. Aggregation typically involves sintering to fuse the colliding primary particles together. An important aspect of the growing 306 within the flame reactor is to control conditions within the flame reactor to promote the desired collision and fusing of particles following nucleation.

In other embodiments, the growing 306 may occur or be aided by adding additional material to the nanoglass particles following nucleation. In this situation, the conditions of the flame reactor are controlled so that the additional material is added to the nanoglass particles to increase the weight average particle size of the nanoglass particles into the desired range. Growth through addition of additional material is described in more detail below. In some embodiments, the growing 306 may involve both collision/aggregation and material additions.

Preferably, the residence time of the flowing stream in the flame spray reactor is very short. Short residence times are desired for forming amorphous nanoglass particles, particularly when coupled with high flame temperatures, e.g., flame temperature ranging from 1500° C. to 2000° C. or greater. The formation of amorphous nanoglass particles may be desired for various applications over the formation of crystalline nanoglass particles, for example, in applications for etching substrates, e.g., etching silicon nitride in the formation of photovoltaic cells. Generally speaking, amorphous nanoglasses may have a lower melting point or glass transition point compared to crystalline materials. In some cases, low melting glasses may be utilized for the photovoltaic applications because of the firing conditions used in photovoltaic cell processing. As used herein, "amorphous" means substantially lacking crystalline peaks as determined by X-Ray Diffraction and/or the absence of long range order over distance greater than a few atoms. For the formation of larger and/or crystalline nanoglass particles, it is important to provide sufficient residence time at sufficiently high temperature to permit the desired nanoglass particle growth and/or crystallization. By the term "residence time" it is meant the length of time that the flowing stream, remains within a particular zone (e.g., primary zone or secondary zone) based on the average stream velocity through the zone. The residence time within the primary zone and flame is generally less than one second, and more typically significantly less. Often the flowing stream has a residence time in the primary zone from 10 to 1000 milliseconds, e.g., 10 to 500 milliseconds or 10 to 100 milliseconds, with shorter residence times preferred for the formation of amorphous nanoglass particles as indicated above. The residence time within the secondary zone will typically be at least twice as long, four times as long, six times or ten times as long as the residence time in the primary zone (and also as the residence time in the flame). Often, the residence time in the secondary zone is at least an order of magnitude longer than the residence time in the primary zone. The residence time of the flowing stream in the secondary zone is often in a range having a lower limit selected from the group consisting of 0.05 to 10 seconds, e.g. 0.1 to 2 seconds, or 0.5 to 1 second. In the foregoing discussion, it should be understood that the residence times discussed above with respect to the flowing stream through the secondary zone would also be the residence time of the nanoglass in the secondary zone, since the nanoglass are within the flowing stream.

In determining an appropriate residence time of the nanoglass particles in the secondary zone there are several considerations. Some of the considerations include the desired weight average particle size, the melting temperature (and sintering temperature) of materials in the nanoglass particles, the temperature within the secondary zone, residence time in the secondary zone and the volume concentration of the nanoglass particles in the flowing stream (volume of nanoglass particles/volume of per unit volume of the flowing stream).

FIG. 4B shows an embodiment of flame reactor 400 comprising secondary zone 420 for aiding growth of the nanoglass particles to attain a weight average particle size within the desired range. As shown in FIG. 4B, the secondary zone 420 is a volume within conduit 402 that is downstream from the primary zone 408. The secondary zone 420 will typically be longer and occupy more of the internal reactor volume than the primary zone 408, and the residence time in the secondary zone 420 would typically be significantly greater than in the primary zone 408. As the flowing stream in the flame reactor 400 exits the primary zone 408 and enters secondary zone 420, the nanoglass particles are growing. In secondary zone 420, conditions are maintained that promote continued growth of the nanoglass particles to a large size within the desired weight average particle size range.

These larger-size nanoglass particles are desirable for many applications, because the larger-size nanoglass particles are often easier to handle, easier to disperse for use and more readily accommodated in existing product manufacturing operations. By larger-size nanoglass particles, in this context, it is meant those having a weight average primary particle size of at least 50 nm, more typically at least 70 nm and often at least 100 nm or even larger. Growing nanoglass primary particles to those larger sizes will generally require a controlled secondary zone in the flame reactor, because the particle size attainable in the primary zone is typically much smaller than the size obtainable in the secondary zone. Also, it is important to emphasize again that the size of the nanoglass particles as used in this context refers to the primary particle size of individual nanoglass domains, and should not be confused with the size of aggregate units of necked-together primary particles. Unless otherwise specifically noted, particle size herein refers only to the size of identifiable primary particles, which may or may not be aggregated to form nanoglass aggregates. The primary particle size may be controlled mainly by the flame temperature and, to a lesser extent, by the particle concentration in the flame. Adding more heat or preventing heat losses downstream of the flame can promote particle growth by keeping the particles hotter longer. If sufficient time and temperature are provided in the secondary zone, it is possible that some of the aggregates formed in the primary zone may collapse to a single primary particle.

Optionally, the secondary zone 420 comprise insulator 422 which surrounds and insulates the portion of the conduit 402 that includes the secondary zone 420. The insulator 422 is used to reduce heat transfer out of the flowing stream in secondary zone 420. Enhanced retention of heat in the secondary zone allows the nanoglass particles in the flowing stream to be maintained at higher temperatures in the secondary zone than if insulator 422 had not been used. Insulator 422 may be made of any material or combination of materials and have any structure that provides a desired level of insulation. Some examples of materials for use in the insulator 422 include those materials described above with respect to the construction of the conduit through the flame reactor. For example, the insulation may comprise a refractory material such as alumina, silica and zirconia.

In an alternative embodiment, the secondary zone 420 may comprise a heating system (not shown) for maintaining the temperature in the secondary zone 420. The heating system may comprise a plurality of flames that surround the interior of the secondary zone 420 or additional burners that form an elongated flame that extends from the primary zone 408 to the 420.

With respect to the volume concentration of nanoglass particles flowing through the secondary zone, if such volume concentration is sufficiently large, then the nanoglass particles will tend to collide more frequently providing greater opportunity for particle growth more quickly, requiring less residence time within the secondary zone to achieve a desired weight average aggregate particle size. Conversely, if the nanoglass particles concentration within the secondary zone is small, the collisions between nanoglass particles will be less frequent and aggregate particle growth will necessarily proceed more slowly. Moreover, there is a particular volume concentration of nanoglass particles, referred to herein as a "characteristic volume concentration," below which particle collisions become so infrequent that for practical purposes the nanoglass particles effectively stop growing due to particle collisions. Another way of describing the characteristic volume concentration of nanoglass particles is that it is the minimum volume concentration of nanoglass particles in the secondary zone that is necessary from a practical perspective to achieve a particular weight average aggregate particle size for the nanoglass particles through collisions in a residence time that is reasonably practical for implementation in a flame reactor system. The characteristic volume concentration will be different for different weight average particle sizes.

The volume concentration of nanoglass particles within the secondary zone may be at any appropriate volume concentration, provided that the volume concentration should at least be as large as the characteristic volume concentration for the minimum weight average particle size desired for at least some period of time during the growing in the secondary zone in the flame reactor.

As will be appreciated, unless the temperature of the flowing stream is maintained at a constant level through the entire secondary zone, the volume concentration of the particles in the flowing stream will change as the gas volume expands and contracts with changing temperature. For example, when the temperature of the flowing stream is lowest at the end of the secondary zone, the flowing stream will typically attain its highest volume density of nanoglass particles, which should preferably be at least as large as the characteristic volume density for the desired nanoglass particles weight average particle size. However, even though the volume concentration of nanoglass particles generally increases with decreasing temperature, it is important that when the volume concentration is above the characteristic volume concentration, that the temperature in the secondary zone is also high enough so that when particle collisions occur, the particles are likely to quickly fuse together, as discussed in more detail below.

If the temperature within the secondary zone is set to promote the growth of the nanoglass particles through collisions of the nanoglass particles (i.e. high enough for colliding particles to fuse to form a single nanoglass particle), then control of the volume concentration of the nanoglass particles and residence time in the secondary zone are the two most important control variables. Thus, if the volume concentration of nanoglass particles in the secondary zone is maintained at a specific concentration, then the residence time within the secondary zone will be changed in order to achieve the desired extent of collisions to achieve a weight average particle size in a desired range. However, if the residence time is set, then the volume concentration of nanoglass particles within the secondary zone may be controlled so that the desired weight average particle size is achieved within the set residence time. Control of the weight average particle size may be achieved for example by changing the temperature in the secondary zone and changing the concentration of the precursor in feed to the primary zone, or a combination of the two. Conversely, for a set residence time and temperature profile in the secondary zone, the concentration of precursor medium (and other precursors) fed to the primary zone may be adjusted to achieve a desired volume concentration in the secondary zone to achieve at least the characteristic volume concentration for a desired weight average particle size.

Temperature control in the secondary zone of the flame reactor is very important. Maintaining the temperature of the secondary zone within a specific elevated temperature range may include retaining heat already present in the flowing stream (e.g., residual heat from the flame in the primary zone). This may be accomplished, for example, by insulating all or a portion of the conduit through the secondary zone to reduce heat losses and retain a higher temperature through the secondary zone. In addition to or instead of insulating the secondary zone, heat may be added to the secondary zone to maintain the desired temperature profile in the secondary zone.

The temperature in the secondary zone should maintained below a temperature at which materials of the nanoglass particles would vaporize or thermally decompose, but above a sintering temperature of the nanoglass particles. By "sintering temperature" it is meant a minimum temperature, at which colliding nanoglass particles will fuse to form a new aggregate particle within the residence time of the secondary zone. Under high sintering temperatures and/or long residence times, colliding primary particles may fully merge into one another forming a new larger primary particle in which the original nanoglass particle domains are no longer identifiable. The sintering temperature of the nanoglass particles will, therefore, depend upon the material(s) in the nanoglass particles and the residence time of the nanoglass particles in the secondary zone. In those embodiments where the growing the nanoglass particles includes significant growth through particle collisions, the nanoglass particles should be maintained at, and preferably above, the sintering temperature in the secondary zone.

When the nanoglass particles are multi-phase particles, the "sintering temperature" of the nanoglass particles will vary depending upon the materials involved and their relative concentrations. Typically, the sintering together will be dictated by the lowest melting temperature material so long as that material is sufficiently exposed at the surface of colliding particles to permit the low-melting temperature domains to fuse to an extent to result in a new primary particle through the action of the lower-melting temperature material.

In a variation of the present invention, the nanoglass particles are maintained through at least a portion of, and perhaps the entire secondary zone, at or above a melting temperature of at least one material in the nanoglass particles, promoting rapid fusing and formation of a new primary particle. In another variation, the nanoglass particles are maintained, through at least a portion of and perhaps the entire secondary zone, at a temperature that is within some range above or below the melting temperature of at least one material of the nanoglass particles. For example, the temperature of the flowing stream through at least a portion of the secondary zone may be within a temperature range of from 300° C. below the melting point of the component to 300° C. above the melting point of the component, e.g. 200° C. below to 200° C. above the melting point or 100° C. below to 100° C. above the melting point. The temperature is provided such that the upper limit must be below a vaporization temperature of the component and below a decomposition temperature of the component where the component decomposes prior to vaporizing. In a further variation, the temperature of the flowing stream in the secondary zone does not exceed a temperature within a range of 100° C. to 2000° C., e.g. 200° C. to 1200° C. or 300° C. to 900° C. As used herein, the temperature in the secondary zone and the stream temperature in the secondary zone are used interchangeably and refer to the temperature in the stream in the central portion of a cross-section of the conduit. As will be appreciated, the flowing stream will have a temperature profile across a cross-section of the flow at any point, with the temperature at the edges being higher or lower than in the center of the stream depending upon whether there is heat transfer into or out of the conduit through the wall.

In one variation, the temperature through some portion of or through the entire secondary zone may be within some range of the softening temperature of the metal oxides, e.g., within 250° C. of the softening temperature. By the phrase "within 250° C. of the softening temperature" it is meant all of the temperatures that are in the range that has a minimum of 250° C. below the softening temperature of the metal oxides included in the nanoglass particles and a maximum of 250° C. above the softening temperature of the metal oxides included in the nanoglass particles. In this implementation, for example, the temperature through at least a portion of the secondary zone may be from 200° C. below the softening temperature of the component to 200° C. above the softening temperature of the component, e.g. 150° C. below to 150° C. above the softening temperature or 100° C. below to 100° C. above the softening temperature.

The embodiment of flame reactor 400 shown in FIG. 4B is merely one example of a flame reactor 400 for use with performing the method of the present invention. In other embodiments, the primary zone 408 and the secondary zone 420 may be within different conduit configurations or within different equipment or apparatus in fluid communication. Additionally, as further described below, the primary zone 408 and the secondary zone 420 may be separated by other processing zones such as a quench zone 430 shown in FIG. 4C and/or a particle modifying zone 440 shown in FIG. 4D.

With reference again to FIG. 3B, in some embodiments, the growing 306 includes adding additional material to the nanoglass particles (other than by collision/aggregation) to increase the weight average particle size into a desired size range. The additional material may be the same or different than the material resulting from the precursor medium discussed above.

When the additional material includes the same component as the component provided by the precursor medium, discussed above, the additional amount of the component added to the nanoglass particles may be derived from addition of more of the precursor medium or from a different precursor medium or precursors. Moreover, the additional material added to the nanoglass may result from additional precursor or precursors introduced into the flame reactor separate in the primary zone and/or the secondary zone. Alternatively, additional precursors may be introduced separately into the flame reactor into the primary and/or secondary zone.

With continued reference to FIG. 3B, when the growing 306 includes growing the nanoglass particles through collisions, in one implementation the growth may be aided by the use of a fluxing material. By the term "fluxing material" or simply "flux", which are used interchangeably herein, it is meant a material that promotes and aids in fusing, sintering or coalescing of two colliding nanoglass particles to form a new larger primary particle larger in size than either of the two colliding nanoglass particles. The previously described embodiment of adding an additional material to the nanoglass particles in secondary zone 420 that is of a lower melting temperature than other materials in the nanoglass particles is one example of the use of a fluxing material. However, the use of a fluxing material is not limited to that embodiment. For example, a fluxing material does not have to be a liquid or be in a liquid phase during the growing 306 in order to aid in growing the nanoglass particles. In some cases, the fluxing material may be a solid phase.

The fluxing material may be introduced into the flame reactor at any convenient location as long as the introduction and subsequent processing results in exposure of the fluxing material at the surface of the nanoglass particles through at least some portion of the secondary zone 420 during the growing 306. As one example, the fluxing material may be introduced as part of the flowing stream during the introducing 300 into primary zone 408. As another example, the fluxing material may be added into secondary zone 420. One advantage of introducing the fluxing material in the secondary zone 420 is the ability to controllably deposit the fluxing material on the outside of the nanoglass particles. The fluxing material should be introduced in such a manner and/or be of such a type that the fluxing material deposits on the surface of already formed nanoglass or through phase interaction in the nanoglass migrates to the surface of the nanoglass, so that it is will be available at the surface of the nanoglass to aid growth of colliding particles. The fluxing material does not, however, have to completely cover an outside surface of the nanoglass, but only needs to be exposed at over a sufficient portion of the surface to provide the growth aiding effect to colliding particles.

The specific type of fluxing material used in an embodiment of the present invention will depend on the materials included in the nanoglass particles. However, any material that will aid in sintering, coalescing and fusing nanoglass particles together may be used with the present invention. One example of a class of materials that are useful as fluxing material include salts, such as alkali metal halides, with some nonlimiting specific examples including potassium chloride and sodium chloride. Salts are useful fluxing materials particularly when the nanoglass include phosphors such as $Y_2O_3$: Eu; $Y_2O_2S$ doped with Eu and/or Tb; ZnS doped with Au, Al and Cu; ZnS doped with Ag or Cl; $SrGa_2S_4$ doped with Eu and/or Ce; $Y_5(Ga,Al)_5O_{12}$ doped with Tb or Cr; $Zn_2SiO_4$:Mn; and $Y_2SiO_5$ doped with Tb or Ce.

Although the use of a fluxing material may be used in the manufacture of nanoglass of any composition, the technique is especially useful in the manufacture of nanoglass that includes high-melting temperature material(s). High-melting temperature materials may have a melting temperature of at least as high as or higher than a temperature selected from the group consisting of 1800° C., 1900° C., 2000° C., and 2200° C., but generally lower than 3000° C. or even lower than 2500° C. Some examples of metals that may be considered high-melting temperature materials include boron, chromium, hafnium, iridium, molybdenum, niobium, osmium, rhenium, ruthenium, tantalum, tungsten and zirconium. Some classes of ceramics that include materials that may be considered as being high-melting temperature materials include oxides, nitrides, carbides, tellurides, selinides, titanates, tantalates and glasses. Nanoglass containing only high-melting temperature material(s) are difficult to maintain at a high enough temperature for a long enough time for adequate sintering to obtain significant particle growth through the collision route. Rather, such nanoglass tend to either not agglomerate at all or form only agglomerate units of small primary particles joined by necking. Thus, they must be maintained at high temperatures for long residence times to obtain any significant particle growth after exiting the flame. In some cases the necessary residence times may be impractical within a flame reactor. With the use of a fluxing material, however, larger nanoglass containing the high-melting temperature material(s) may be formed.

Figure 3C:
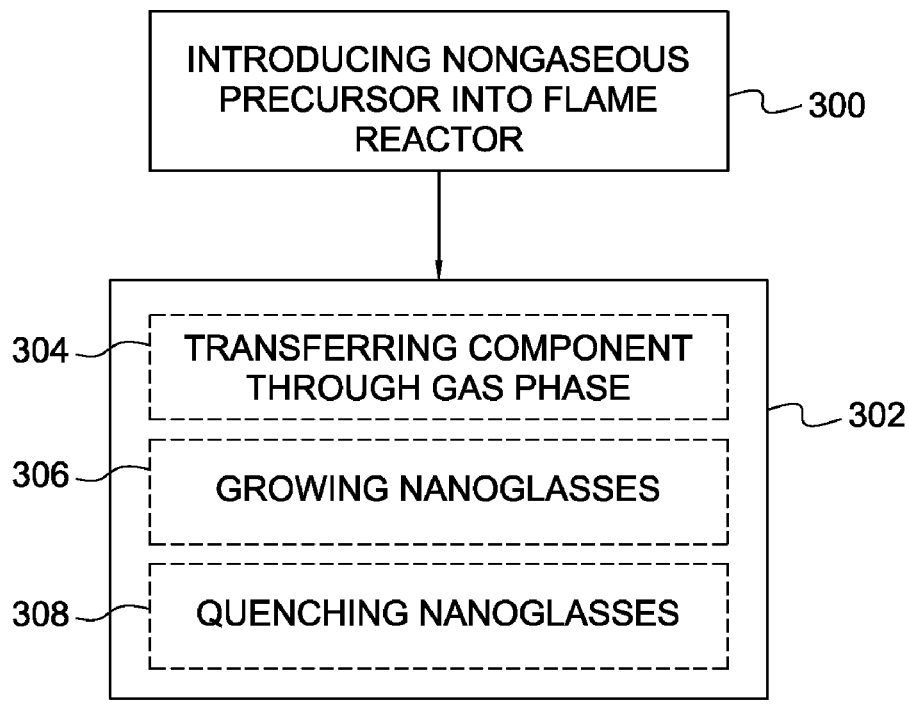
FIG. 3C is a generalized process block-diagram of one embodiment of the method of the present invention for quenching nanoglass particles.
Figure 4C:
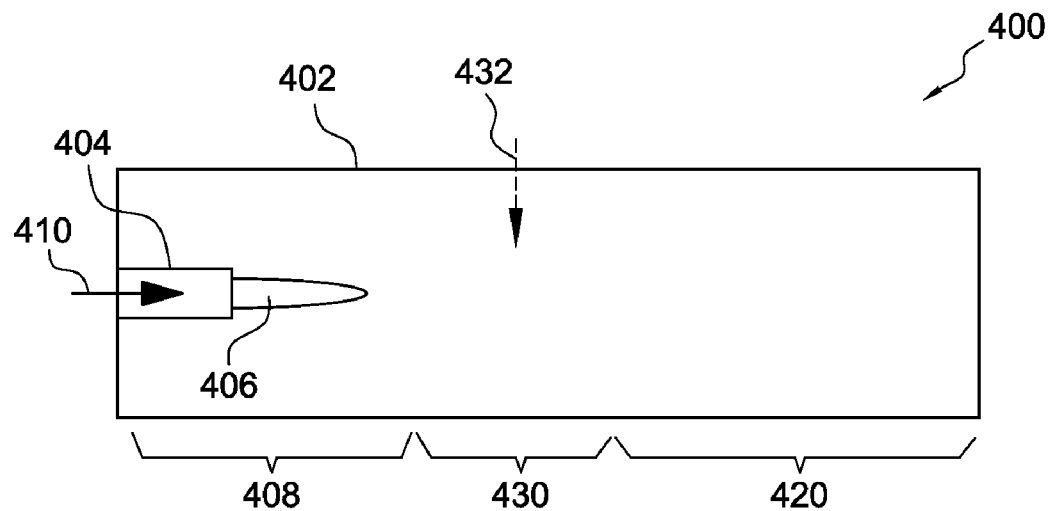
FIG. 4C is a side view of a flame reactor having a quenching zone that may be used to implement one embodiment of the method of the present invention.

FIG. 3C illustrates a generalized process block diagram of another embodiment of the method of the present invention that includes the growing 306 followed by the quenching 308. In the quenching zone 430 shown in FIG. 4C, the quenching of the nanoglass particles occurs by mixing a quench gas from feed 432 into the flowing stream from the flame 406. The quench gas used to lower the temperature of the nanoglass particles is at a lower temperature than the flowing stream, and when mixed with the flowing stream, it reduces the temperature of the flowing stream, and consequently also the nanoglass particles in the flowing stream. The quenching 308 may reduce the temperature of the nanoglass particles by any desired amount. For example, the temperature of the flowing stream may be reduced by an amount of from 10° C. to 2500° C., e.g. 50° C. to 1500° C. or 100° C. to 1000° C. Typically, however, the temperature of the flowing stream should not be cooled to a temperature at which contaminant materials would condense out of the gas phase in the flowing stream. As shown in FIG. 4C, the quenching zone 430 separates the primary zone 408 from the secondary zone 420.

Optionally, in other embodiments, the quenching zone 430 shown in FIG. 4C may be in a conduit portion having a different shape, diameter or configuration than the primary zone 408. One example of a quench system that may be used as a quench zone to implement the method of the present invention is disclosed in U.S. Pat. No. 6,338,809, the entire contents of which are hereby incorporated by reference.

The quench gas used in the quenching zone 430 may be any suitable gas for quenching the nanoglass particles. The quench gas may be nonreactive after introduction in the flame reactor 400 and introduced solely for the purpose of reducing the temperature of the flowing stream. This might be the case for example, when it is desired to stop the growth of the nanoglass particles through further collisions. The quenching gas from feed 432 helps to stop further growth by diluting the flowing stream, thereby decreasing the frequency of particle collisions, and reducing the temperature, thereby reducing the likelihood that colliding particles will fuse together to form new primary particles or aggregated nanoglass particles. When it is desired to stop further particle growth, the cooled stream exiting the quenching zone 430 should preferably be below a sintering temperature of the nanoglass particles. The cooled nanoglass particles may then be collected, i.e., separated from the gas phase of the flowing stream. The quenching 308 may also be useful in retaining a particular property of the nanoglass particles as they have formed and nucleated in the flowing stream. For example, if the nanoglass particles have nucleated and formed with a particular phase that is desirable for use in a final application, the quenching 308 may help to retain the desirable phase that would otherwise crystallize if not quenched. In other words, the quenching 308 may be useful to stop crystallization of the nanoglass particles if it is desirable to form amorphous nanoglass. Alternatively, the quench gas may be non-reactive, but is not intended to stop nanoglass particle growth, but instead to only reduce the temperature to accommodate some further processing to occur at a lower temperature. As another alternative, the quench gas may be reactive in that it includes one or more components that is or becomes reactive in the flame reactor, such as reactive with material of the nanoglass particles or with some component in the gas phase of the flowing stream in the flame reactor. As one example, the quench gas may contain a precursor for additional material to be added to the nanoglass particles. The precursor may undergo reaction in the quench zone prior to contributing a material to the nanoglass particles, or may not undergo any reactions. In one specific example, the quench gas may contain oxygen, which reacts with unoxidized metal in the nanoglass particles to promote production of a metal oxide in the nanoglass particles.

In addition to a gas phase, a quench fluid introduced into the flame reactor may also include a nongaseous phase, e.g., a disperse particulate and/or disperse droplet phase. The nongaseous phase may have any one of a variety of functions. For example, a nongaseous phase may contain precursor(s) for material(s) to be added to the nanoglass particles. As another example, the quench gas may include a nongaseous phase that assists in lowering the temperature of the nanoglass particles, such as water droplets included to help consume heat and lower the temperature as the water vaporizes after introduction into the flame reactor. Other nongaseous phases may be used to assist lowering the temperature by consumption of heat through vaporization, however water is often preferred because of its low cost and high latent heat of vaporization.

Optionally, embodiments of the present invention may comprise an additional quenching zone (not shown) that occurs after the growing 306 in the secondary zone 420. The additional quenching may prepare the nanoglass particles for further processing or for collection.

The previous descriptions with respect to FIG. 4C are provided merely as illustrative examples of different embodiments that incorporate a quenching step 308. The method of the present invention may include additional quenching zones. In some embodiments, a quenching step 308 may follow and/or precede other processing steps or substeps that have been previously described or that are described below, or other steps not described herein the inclusion of which are not incompatible with other processing. Additionally, in those embodiments that include more than one quenching step, the quench gas used in each of the steps may be the same or different. Also, some embodiments of the present invention may have a primary zone 408 and a quenching zone 430 without a secondary zone 420.

Figure 3D:
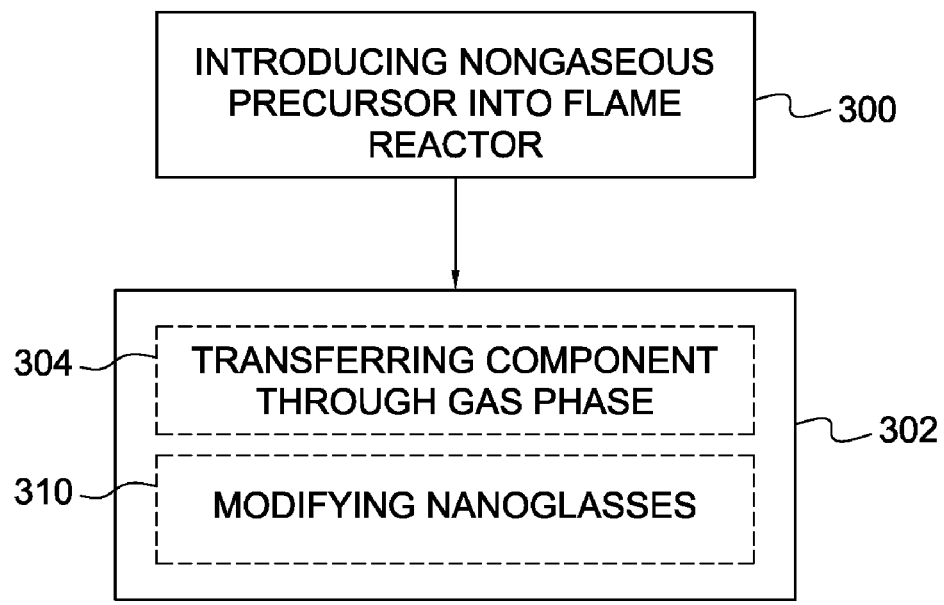
FIG. 3D is a generalized process block-diagram of one embodiment of the method of the present invention for modifying nanoglass particles.

FIG. 3D shows a generalized process block diagram of another embodiment of the method of the present invention where the forming 302 includes modifying 310 nanoglass particles. The modifying nanoglass particle step 310 may be useful, for example, to change the properties of the nanoglass particles after they have formed and/or have been grown into a desired weight average particle size. By the term "modify" or "modifying," it is meant a change to the nanoglass particles that does not necessary involve increasing the weight average particle size of the nanoglass particles. The modification may be morphological or chemical. By morphological it is meant changes to the structure of the nanoglass particles, with some nonlimiting examples including a redistribution of phases within the nanoglass particles, creation of new phases within the nanoglass particles, crystallization or recrystallization of the nanoglass particles and homogenization of the nanoglass particles. A chemical modification to the nanoglass particles includes compositional changes to the nanoglass particles such as adding an additional component or removing a component from the nanoglass particles to change the chemical composition of the nanoglass particles, preferably without substantially increasing their weight average particle size. For example, the nanoglass particles may be doped with a doping material to change the luminescent, conductive, magnetic or other materials properties of the nanoglass particles. In another example, a surface modifying material may be added to the surface of the nanoglass particles in order to aid the dispersion of the nanoglass particles for use in a final application.

Figure 4D:
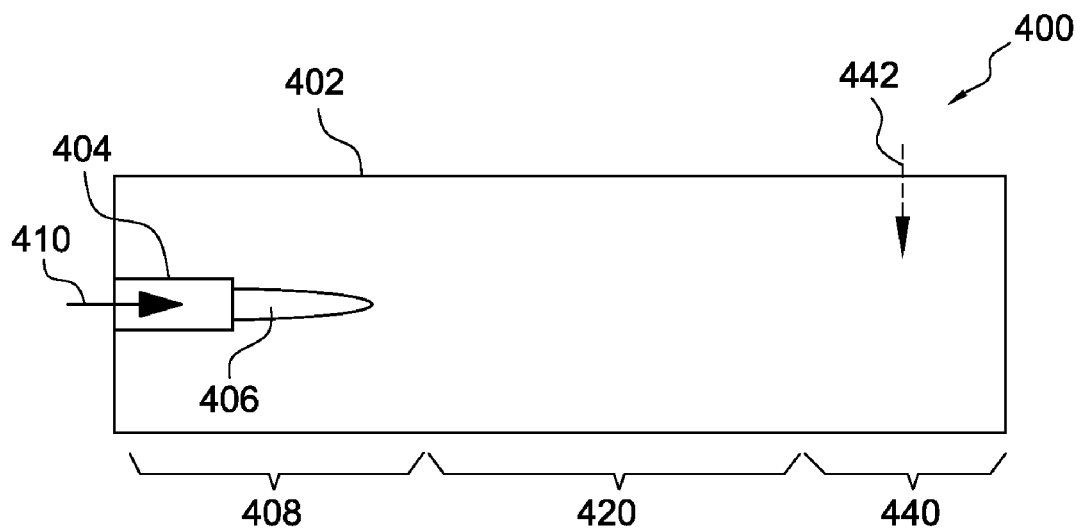
FIG. 4D is a side view of a flame reactor having a modifying zone that may be used to implement one embodiment of the method of the present invention.

In FIG. 4D the flame reactor 400 comprises a modifying zone 440 that is used to perform the modifying nanoglass particles 310. Unless subjected to a prior quench, the flowing stream in the modifying zone 440 will still typically be at an elevated temperature because of the residual heat from upstream operations. However, the temperature will often preferably be significantly below those temperatures described above with respect to the secondary zone 420 during the growing 306, and a quench zone 430 may be useful between the secondary zone 420 and the modifying zone 440 to adjust the temperature as desired. For example, the temperature of the nanoglass particles when processed through the modifying 440 will typically be significantly lower than a melting temperature of any of the materials in the nanoglass particles and preferably below the sintering temperature of the nanoglass particles, to avoid growth of the nanoglass particles through collisions. In any case, the nanoglass particles should be maintained at a temperature at which the desired modification of the nanoglass particles occurs.

The modifying zone 440 may be designed similarly with discussions above concerning design of the secondary zone 420. For example, the modifying zone 440 may include an insulator or heating system as discussed above with reference to FIG. 2B.

Optionally, an additional feed 442 of modifying material that may be introduced into the modifying zone 440 when the modifying includes a chemical, or compositional, modification. The feed 442 of modifying material may be introduced into the modifying zone 440 in a variety of ways, such as for example, the modifying feed 442 may be introduced through a burner (not shown) and into a flame in modifying zone 440. In one specific example of adding a modifying material in feed 442, a material may be introduced in feed 442 that prevents the nanoglass particles from growing. The modifying material may be an organic material or an inorganic material that deposits on the surface of the nanoglass particles and prevents them from growing by modifying the surface of the nanoglass particles so that when they collide they do not stick together and join. Some nonlimiting examples of ways in which the modifying material may prevent the nanoglass particles from fusing together when colliding include, by depositing a hard material on the nanoglass particles so that they are more likely to bounce off of each other than to stick together and by depositing an ionic material that will repel nanoglass particles away from each other. It should be noted that the modifying material might increase the weight average aggregated nanoglass particle size, because additional material is being added to their surface, but preferably does not significantly increase their size, or if the size is appreciatively increased the weight average particle still remains within a desired range. Moreover, the modifying material may, in addition to being useful to prevent the nanoglass particles from growing, be useful in a final application of the nanoglass particles. However, in other cases, the modifying material may only be used to prevent the nanoglass particles from growing while in flame reactor 400 or agglomerating during or following collection and may be removed before the nanoglass particles are used in a final application. The additional material may be removed from the nanoglass particles in a variety of ways, such as for example dissolved by a solvent, vaporized, reacted away, or a combination of the foregoing, preferably with minimal effect on the properties of the nanoglass particles.

A compositional modification in the modifying zone 440, may include any modification of the composition of the nanoglass particles. One such modification is to coat the particles with a coating material. Such coating may be accomplished in the particle modifying for example, by physical vapor deposition (PVD), chemical vapor deposition (CVD), gas-to-particle conversion, or conversion of a material of the nanoglass particles at the particle surface.

It should also be noted that the method of the present invention is not limited to the embodiments described herein where feed 442 is used to introduce a modifying material into the flame reactor 400. In some instances a modifying material may already be present in the flowing stream when the flowing stream enters the modifying zone 440, such as for example by virtue of having been included in the flowing stream during the introducing 300, or by having been introduced into the flame reactor upstream from the modifying zone 440. In those cases, the modifying material may have the same purpose and functions as previously described above with respect to introducing the modifying material in feed 442. In other cases modifying materials may be introduced at other various locations in the flame reactor 400.

The residence times of the nanoglass particles within the modifying zone 440 will vary depending on the desired modification of the nanoglass particles. Typical residence times of the nanoglass particles within the modifying zone 440 may be similar to the residence times within the secondary zone 420, discussed above.

In one specific embodiment of the present invention, the volume concentration of nanoglass particles in the flowing stream will be controlled so that it is at or below the characteristic volume concentration when in the modifying zone 440 to inhibit further particle growth. Additionally, with such a low volume concentration of the nanoglass particles, the modifying 440 may be performed at higher temperatures than if the volume concentration were above the characteristic volume concentration.

In other embodiments, the flame reactor may include more than one modifying zone, and the method will include more than one modifying nanoglass particles step. Additionally, the modifying nanoglass particles steps may be combined in any order with other steps or substeps that have previously been described or that are described below.

The ability to combine steps and substeps discussed above provides advantages in processing nanoglass particles with complex materials (i.e., materials with more than two elements). Some examples of complex materials include mixed metal oxides. One problem with processing nanoglass particles that include complex materials is that often times the component materials in the complex materials have very different properties such as vaporization temperatures (i.e., boiling points) that make formation of the nanoglass particles in a single processing step difficult. For example, a first component of the complex material may have a very high vaporization temperature, while a second component a very low vaporization temperature. If processed in a single step, both components will be in a single gas phase while in a primary zone. As the temperature of the gas phase drops, the first component will nucleate and form nanoglass particles, then as the temperature falls further, the second component will deposit on the first component and/or nucleate and form separate nanoglass particles. Thus, the resulting nucleated nanoglass particles will be nanoglass particles with two phases (i.e., core/shell) and/or two separate nanoglass particles of distinct compositions.

In several embodiments of the present invention, a combination of substeps that include combinations of the growing 306, quenching 308 and modifying 310 may be used in various combinations to process nanoglass particles that include complex materials. One example includes introducing a first component, having a high-vaporization temperature, and a second component having a low-vaporization temperature into a primary zone of a flame reactor. As the nanoglass particles begin to nucleate and form, they may be subjected to a quenching step that reduces the temperature of the nanoglass particles to a temperature below the vaporization temperature of the second component in the form it exists in the vapor phase, causing the second component to come out of the vapor phase for inclusion in the nanoglass particles, promoting inclusion of both the first component and the second component in the nanoglass particles. Additionally, the quenching may be followed by modifying where the nanoglass particles are maintained at a temperature that will homogenize them to evenly distribute the first and second components throughout the nanoglass particles.

Another aspect of flame reactors used with the method of the present invention are features that prevent or reduce thermophoretic losses especially in secondary zones, quench zones and modifying zones. As previously described, in some methods of the present invention, nanoglass particles will have relatively long residence times in secondary zones, quench zones and modifying zones. One potential problem that may occur in situations where nanoglass particles have long residence times within a zone is thermophoretic loss. By the term "thermophoretic loss" it is meant the loss of nanoglass particles by deposition of the nanoglass particles onto the walls of the conduit. The thermophoretic losses are caused by differences in temperature between the hot material in the flowing stream and the cooler walls of a zone. This difference in temperature creates a force that draws the hot material in the flowing stream, including the nanoglass particles to the walls of a zone where they will deposit onto the walls. Thermophoretic losses result in an inefficient process that produces less nanoglass particle yield per amount of precursor. Thus, flame reactors that are used with the method of the present invention preferably include features that help to limit or avoid thermophoretic losses. Such features include barrier walls around the inside surface of the conduit, the use a barrier gas, such as nitrogen or an inert gas, the use of a heated wall, a highly reflective interior wall of the conduit, and/or a wall having an aperture through which the flame is maintained. These features are described in U.S. Ser. No. 11/335,727, filed on Jan. 20, 2006, the entire contents and disclosure of which is hereby incorporated by reference.

An additional consideration in performing the methods of the present invention include control of the flame characteristics used in forming the nanoglass particles. The characteristics of the flame may affect the efficiency of the process, production rate of nanoglass particles, and the properties of the nanoglass particles. The previous descriptions with respect to the various burners that may be used in flame reactors for performing the methods of the present invention and the combinations of feeds introduced into the burners are applicable for controlling the characteristics of the flames. It should be noted that in some cases it might be preferable to have flames with less uniform shapes. In those particular cases, typical cylindrical flames may be appropriate for use in making nanoglass particles.

In addition to the shape of the flames, which may help control temperature profiles, it is also possible to control the feeds introduced into a burner. One example of an important control is the ratio of fuel to oxidant that is fed into a flame. In some embodiments, the nanoglass particles or the precursor medium introduced into a flame may be easily oxidized, and it may be desirable to maintain the fuel to oxidant ratio at a fuel rich ratio to ensure that no excess oxygen is introduced into the flame. Some materials that are preferably made in a flame that is fuel rich include materials such as metals, nitrides, and carbides. The fuel rich environment ensures that all of the oxygen that is introduced into a flame will be combusted and there will be no excess oxygen available in the flame reactor to oxidize the nanoglass particles or precursor medium. In other embodiments, it may be desirable to have a fuel to oxidant ratio that is rich in oxygen. For example, when making metal oxide ceramics, it may be desirable to maintain the environment within a flame and in the flame reactor with excess oxygen. In yet other embodiments, the fuel to oxygen ratio introduced into the flame may not be an important consideration in processing the nanoglass particles.

In addition to the environment within the flame and the flame reactor, the fuel to oxidant ratio also controls other aspects of the flame. One particular aspect that is controlled by the flame is the flame temperature. If the fuel to oxidant ratio is at a fuel rich ratio then the flame reactor will contain fuel that is not combusted. Unreacted fuel obviously generates a flame that is at a lower temperature than if all of the fuel that is provided to the flame reactor is combusted. Thus, in those situations in which it is desirable to have all of the fuel combusted in order to maintain the temperature of a flame at a high temperature, it will be desirable to provide to the flame reactor excess oxidant to ensure that all of the fuel provided to the flame or flame reactor is combusted. However, if it is desirable to maintain the temperature of the flame at a lower temperature, than the fuel to oxidant ratio may be fuel rich so that only an amount of fuel is combusted so that the flame does not exceed a desired temperature.

The specific type of fuel will also affect the temperature of a flame. In addition to the temperature of the flame, the selection of a fuel may involve other considerations. Fuels that are used to combust and create the flame may be gaseous or non-gaseous. The non-gaseous fuels may be a liquid, solid or a combination of the two. In some cases, the fuel combusted to form the flame may also function as a solvent for the precursor medium. For example, a liquid fuel may be used to dissolve a precursor medium and be fed into a burner as dispersed droplets of the liquid containing the dissolved precursor medium. In other embodiments, the liquid fuel may be useful as a solvent for the precursor but not contain enough energy to generate the required heat within the flame reactor for all of the necessary reactions. In this case, the liquid fuel may be supplemented with another liquid fuel and/or a gaseous fuel, which are combusted to contribute additional heat to the flame reactor. Nonlimiting examples of gaseous fuels that may be used with the method of the present invention include methane, propane, butane, hydrogen and acetylene. Some nonlimiting examples of liquid fuels which may be used with the method of the present invention include alcohols, toluene, acetone, isooctane, acids and heavier hydrocarbons such as kerosene and diesel.

As noted above, in some cases the fuel will be a combination of liquids. This embodiment is useful in situations when it is desirable to dissolve the precursor medium into a liquid to disperse the precursor medium. However, the precursor medium may only be soluble in liquids that are low energy fuels. In this case, the low energy fuel may be used to dissolve the precursor medium, while an additional higher energy fuel may supplement the low energy fuel to generate the necessary heat within the flame reactor. In some instances, the two liquid fuels may not be completely soluble in one another, in which case the liquid will be a multiphase liquid with two phases (i.e., an emulsion). In other instances the two liquids may be mutually soluble in each other and form a single phase. It should be noted that in other cases there may be more than two liquid fuels introduced into the flame, the liquids may be completely soluble in one another or may be in the form of an emulsion. It should also be noted that the nongaseous precursor that is introduced into the flame reactor might also, in addition to containing the component for inclusion in the nanoglass particles, act as a fuel and combust to generate heat within the flame reactor.

The oxidant used in the method of the present invention to combust with the fuel to form the flame may be a gaseous oxidant or a nongaseous oxidant. The nongaseous oxidant may be a liquid, a solid or a combination of the two. However, preferably the oxidant is a gaseous oxidant and will typically be oxygen. The oxygen may be introduced into the flame reactor substantially free of other gases such as a stream of substantially pure oxygen gas. In other cases, the oxygen will be introduced into the flame reactor with a mixture of other gases such as nitrogen, as is the case when using air. Although it is preferable to have a gaseous oxidant, in some cases the oxidant may be a liquid. Some examples of liquids that may be used as oxidants include inorganic acids. Also, the oxidant that is introduced into the flame reactor may be a combination of a gaseous oxidant or a liquid oxidant. This may be the case when it is desirable to have the precursor medium dissolved in a liquid to disperse it, and it also desirable to have the oxidant located very close to the precursor medium when in the flame reactor. In this case, the precursor may be dissolved in a liquid solvent that functions as an oxidant.

Figure 3E:
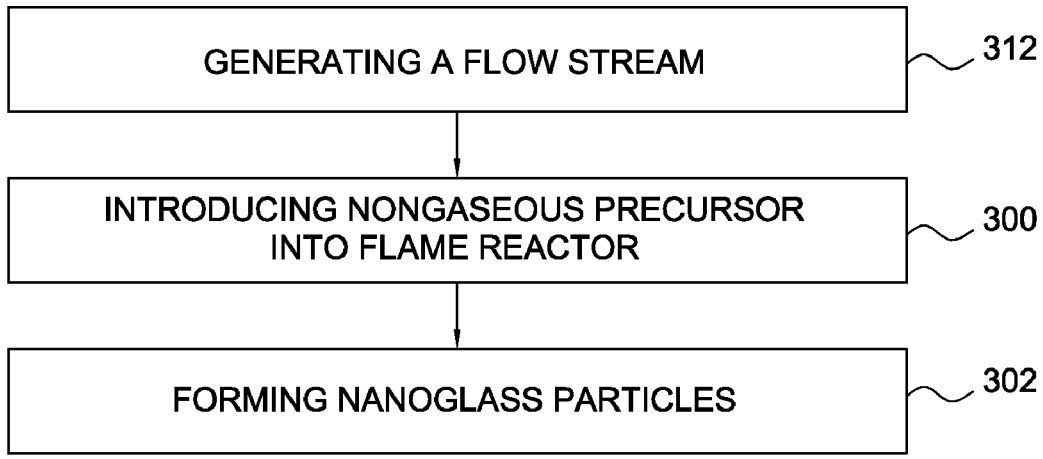
FIG. 3E is a generalized process block-diagram of one embodiment of the method of the present invention that includes generating a flowing stream that is introduced into a flame reactor.

As previously described, the method of the present invention includes introducing a precursor medium into a flame reactor. FIG. 3E shows a generalized process block diagram of another embodiment of the method of the present invention. The block diagram shown in FIG. 3E includes a generating 312 a flowing stream for feed to the flame reactor during the introducing 300. The generating 312 may involve a number of steps, depending on the materials to be included in the flowing stream.

In one embodiment, the disperse phase of the flowing stream includes a liquid, the liquid containing the dissolved precursor medium, which includes the component for inclusion in the precursor medium. In this embodiment, the generating 312 includes steps for dispersing the liquid into droplets within the gas phase. This may be performed using any suitable device that disperses liquid into droplets, such as for example, a nozzle. The nozzle may be any nozzle which is useful for dispersing liquids into droplets. Some examples include ultrasonic nozzles, multi-fluid nozzles and pressurized nozzles.

Ultrasonic nozzles generate droplets of liquid by using piezoelectric materials that vibrate at ultrasonic frequencies to break up a liquid into small droplets. Pressurized nozzles use pressure and a separator or screen in order to break up the liquid into droplets. In some cases, pressurized nozzles may involve use of some vapor that is generated from the liquid itself in order to pressurize and break up the liquid into droplets. One advantage of using ultrasonic and pressurized nozzles is that an additional fluid is not required to generate liquid droplets. This may be useful in situations where the precursor medium dissolved in the liquid is sensitive and/or incompatible with other common fluids used in multi-fluid nozzles, described in detail below.

Multi-fluid nozzles use more than one fluid to generate droplets of a liquid, typically two or three fluids. In a two-fluid nozzle, a gaseous feed and a liquid feed are introduced into the nozzle, and the gaseous feed is used to break up the liquid feed into droplets. Similarly, in a three-fluid nozzle three fluids are introduced into the nozzle, at least one fluid being a gas in order to break up the liquid or liquids into droplets.

The use of multi-fluid nozzles is particularly advantageous in some embodiments of the method of the present invention. This may be done by using a multi-fluid nozzle, either a two-fluid nozzle or a three-fluid nozzle. A two-fluid nozzle may be used by introducing a feed of liquid which contains a dissolved or suspended precursor medium and a feed of a gaseous oxidant, gaseous fuel, additional precursor or a combination thereof to break up the liquid into droplets. In this embodiment, the flowing stream that is generated during the generating will include the precursor medium dissolved in the liquid droplets and the gas phase will include a gaseous oxidant, a gaseous fuel, a gaseous precursor or combination thereof.

In another embodiment, a three-fluid nozzle may be used during the generating to generate a flowing stream that includes the precursor medium. Using a three-fluid nozzle, a liquid with the precursor medium dissolved or suspended therein is fed into the three-fluid nozzle along with a feed of gaseous oxidant and a feed of gaseous fuel to break up the liquid into droplets. Within the three-fluid nozzle, the gaseous oxidant and the gaseous fuel will mix so that the flowing stream that is formed from the generating will include a disperse liquid phase including the precursor medium and a gas phase including the gaseous oxidant and gaseous fuel. The main advantage of this embodiment is that the three-fluid nozzle may allow the simultaneous addition of two precursor streams that are immiscible. A specific example is the introduction one or more precursors in the form of a highly concentrated aqueous solution with the remaining precursors being introduced in an organic solution, the organic solvent being the liquid fuel that supports combustion.

In another embodiment, the use of three fluids in a three-fluid nozzle may be useful for generating a flowing stream that has at least two disperse liquid phases each containing a precursor medium that includes a component for inclusion in the nanoglass particles. In this example, a first liquid feed that includes a first precursor is introduced into the nozzle along with a second feed containing a second precursor and a gaseous feed. The gaseous feed may be a fuel, an oxidant, an additional precursor, an inert gas or a combination of the foregoing. This embodiment may be particularly useful for generating a flowing stream that includes multiple precursors that are soluble in vastly different solvents. This embodiment advantageously allows incompatible precursors or solvents to be mixed for only a short period of time within the nozzle before they are included as disperse phases in the flowing stream.

In another embodiment of the present invention, a three-fluid nozzle is used to introduce at least one liquid fuel into the flowing stream generated during the generating 312. In this embodiment, a first liquid which includes a precursor medium is fed into the nozzle, a second liquid which includes a liquid fuel is also introduced into the nozzle and a gaseous feed is introduced into the nozzle. The gaseous feed may be an oxidant, a fuel, include a gaseous precursor, an inert gas or a combination of the foregoing. Additionally, the liquid in which the precursor medium is dissolved or suspended may be an additional fuel or oxidant.

In addition to the use of a nozzle for dispersing liquid containing the precursor medium, any other suitable device or apparatus for generating disperse droplets of liquid may be used in the generating. One example of a device that is useful in generating droplets of liquid is an ultrasonic generator. An ultrasonic generator uses transducers to vibrate liquids at very high frequencies which breaks up the liquid into droplets. One example of an ultrasonic generator that is useful with the present invention is disclosed in U.S. Pat. No. 6,339,809, referenced previously.

Figure 3F:
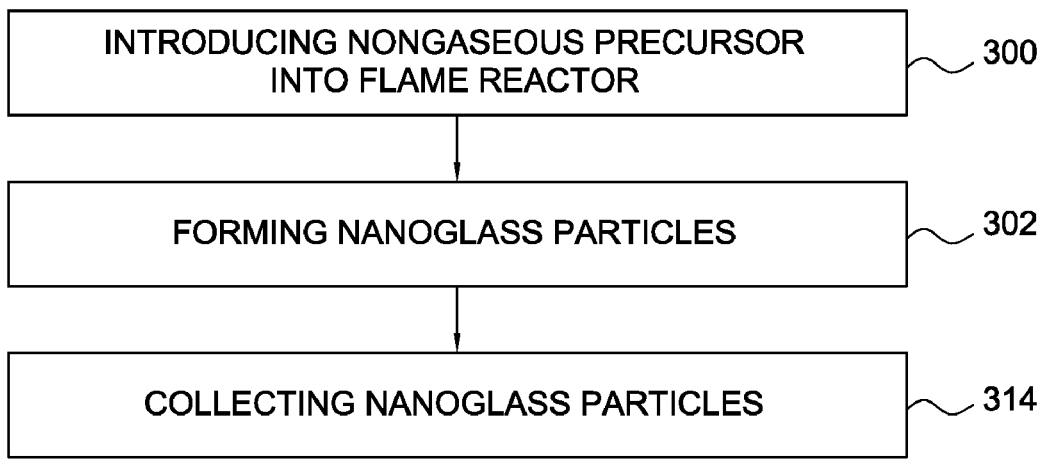
FIG. 3F is a generalized process block-diagram of one embodiment of the method of the present invention that includes collecting the nanoglass particles.

In FIG. 3F, an additional step of collecting 314 the nanoglass particles is provided after the forming 302 of the nanoglass particles. The collecting 314 may be done using filters as shown in FIG. 1.

In one embodiment, the collecting 314 of nanoglass particles may be performed using any suitable methods or devices for separating solid particulate materials from gases.

In one embodiment of the method shown in FIG. 3F, the nanoglass particles are collected dry. In this embodiment, the collecting nanoglass particles 314 may be performed for example, using filters, such as a bag house or an electrostatic precipitator. Electrostatic precipitators are commonly used in collecting small particles and are a preferred device for performing the collecting nanoglass particles step 314 when the collecting nanoglass particles step 314 is performed to collect the nanoglass particles dry.

In other embodiments, the nanoglass particles may be collected using a collection liquid. Any suitable device or method for separating solid particulates from gases using a collection liquid may be used with this embodiment of the present invention. Some nonlimiting examples of devices that may be used in this embodiment include venturi scrubbers, which use a spray of collection liquid to separate nanoglass particles from a gas. A wet wall may also be used to separate the nanoglass particles from gases. The nanoglass particles may be passed through a wall of liquid, so that the nanoglass particles are captured by the liquid while the gases flow through the wet wall. In another embodiment, a wet electrostatic precipitator which works similar to the electrostatic precipitator previously discussed but includes a wet wall where the nanoglass particles are collected is used to perform the collecting nanoglass particles 314. In yet another example, the nanoglass particles may be collected in a liquid bath. The flowing stream containing the nanoglass particles may be directed into or bubbled through a bath of collection liquid, where the nanoglass particles will be collected and the gases will flow through the liquid. These are intended only to be some nonlimiting examples of devices and methods by which the nanoglass particles may be collected using a collecting liquid.

The use of a collecting liquid for performing the collecting nanoglass particles 314 provides a variety of advantages. In one specific embodiment of the present invention, the collecting liquid used in collecting the nanoglass particles 314 contains a surface modifying material. By the term "surface modifying material", it is meant a material that interacts with the surface of the nanoglass particles to change the properties of the surface of the nanoglass particles. For example, the surface modifying material may deposit material onto the surface of the nanoglass particles, bond surface groups to the nanoglass particles or associate materials with the surface of the nanoglass particles. In other cases, the surface modifying material may remove material from the nanoglass particles, such as by removing surface groups or by etching material from the surface of the nanoglass particles.

The nanoglass particles may be made by various implementations of the method of the present invention for a wide variety of applications. Depending upon the final application, the nanoglass particles may, therefore, be made with a wide variety of compositions and other properties. For example, the nanoglass particles may be transparent (such as for use in display applications), electrically insulative (such as for use in resistor applications), thermally conductive (such as for use in heat transfer applications), thermally insulative (such as for use in a heat barrier application) or catalytically active (such as for use in catalysts applications). Nonlimiting examples of possible properties of the nanoglass particles for use in other applications include: thick-film pastes for fabricating electronic devices, dental glass, for use in printing conductive features (typically in combination with conductive particles) that may etch a substrate, e.g., an antireflective layer for formation of a photovoltaic conductive feature, resistors, capacitors, superconductors and planar light-wave circuits.

In a preferred embodiment, the nanoglass compositions of the invention may be formulated into an ink containing conductive phase precursor particles (e.g., metallic particles, such as silver, copper, gold nanoparticles). In such embodiments, the ink may comprise a liquid vehicle, conductive phase precursor particles and nanoglass particles. The ink may comprise the silver in an amount greater than 75 wt. %, e.g., greater than 90 wt. %, greater than 95 wt. % or greater than 98 wt. %, and the nanoglass particles in an amount less than 25 wt. %, e.g., less than 10 wt. %, less than 5 wt. %, less than 2 wt. % or less than 1 wt. %, based on the total weight of the conductive phase precursor particles and the nanoglass contained in the ink. The ink may be deposited by a variety of printing techniques, such as, for example, direct write printing, ink jet printing, syringe deposition, screen printing, lithography, or roll printing.

Thick-films pastes for fabricating electronic devices include a metal component, a glass component, and an organic medium. Nanoglass particles of the present invention may be used in such thick-films. Electronic devices include solar panels, such as those described in U.S. patent application Ser. No. 11/765,313, the entire contents and disclosure of which is hereby incorporated by reference. The nanoglass particles of the invention may also be incorporated into inks, e.g., low viscosity inks, for deposition onto substrates in the formation of photovoltaic panels as described, for example, in U.S. patent application Ser. No. 11/952,580, filed Dec. 7, 2007, the entirety of which is incorporated herein by reference. For example, a first nanoglass containing ink may be deposited onto a substrate containing an antireflective layer and heated in order to etch through the antireflective layer. A second conductive ink may then be deposited in the etched regions of the substrate in order to form conductive features thereon.

Dental filling and restoration compositions are utilized to repair and fill teeth. Such dental compositions typically include a polymerizable monomer matrix with an inorganic filler, such as a glass, dispersed throughout the matrix as described in U.S. Pat. No. 6,623,856, the entire contents and disclosure of which is hereby incorporated by reference. Nanoglass particles of the present invention may be used as inorganic filler in such dental compositions.

The foregoing are nonlimiting examples of materials, properties and applications of use for which the nanoglass may be designed. It should be understood that the precursor medium formed with the method of the present invention may have a variety of applications in other areas as well, and consequently be made with materials and/or properties, different from or in a different combination than those noted above.

All publications, patents and patent applications referred to herein are incorporated by reference in their entirety to the same extent as if each individual publication, patent or patent application was specifically and individually indicated to be incorporated by reference in its entirety.

EXAMPLES

The present invention is further described with reference to the following non-limiting examples.

Example 1

Mixed oxide particles with nominal composition of $Bi_2O_3$: 88.2 wt %, $B_2O_3$:5 wt % and $SiO_2$:5.9 wt % were prepared by spraying a precursor solution containing bismuth nitrate pentahydrate ($Bi(NO_3)_3 \cdot 5H_2O$), boric acid ($H_3BO_3$) and hexamethyldisiloxane (($CH_3)_3SiOSi(CH_3)_3$) dissolved in a 1.68:1 (wt/wt) mixture of ethanol ($CH_3CH_2OH$) and ethylene glycol ($HOCH_2CH_2OH$) into a self-supporting flame. The total solvent concentration in the precursor solution was 85 wt % and the total metal loading of the precursor solution was 5.45 wt %. The precursor solution was atomized with a bi-fluid nozzle at a flow rate of 25 ml/min. Oxygen at 40 standard liters/min was used to atomize the precursor solution and supplemental oxygen at 40 standard liters/min was used to ensure complete combustion. The resulting flame had a yellow-green color. The flame was surrounded by an air stream at a flow rate of 200 standard liters/min. The flame gases were rapidly quenched by spraying water directly into the flame using air-assisted bi-fluid atomizers and approximately 15 centimeters from the burner tip. Additional air at 900 standard liters/min was added downstream of the burner to cool the product particles and the gases furthermore before entering the baghouse filter for particle collection.

The BET surface area measured by $N_2$ adsorption was 11.9 $m^2/g$ and the average aggregate size measured by quasi elastic light scattering was 245 nm. The density of the particles determined by He pycnometry was 7.31 $g/cm^3$. The particles were in the form of aggregates comprising of primary particles of average size 50-70 nm as was calculated from the BET surface area.

Example 2

Mixed oxide particles with nominal composition of $Bi_2O_3$: 55.2 wt %, $B_2O_3$:22.9 wt % and ZnO:21.9 wt % were prepared by spraying a precursor solution containing bismuth nitrate pentahydrate ($Bi(NO_3)_3 \cdot 5H_2O$), boric acid ($H_3BO_3$) and zinc nitrate ($Zn(NO_3)_2 \cdot 6H_2O$) dissolved in a 1.68:1 (wt/wt) mixture of ethanol ($CH_3CH_2OH$) and ethylene glycol ($HOCH_2CH_2OH$) into a self-supporting flame. The precursor solution was atomized with a bi-fluid nozzle at a flow rate of 25 m/min. Oxygen at 40 standard liters/min was used to atomize the precursor solution and supplemental oxygen at 40 standard liters/min was used to ensure complete combustion. The flame had a pronounced green color. The flame was surrounded by an air stream at a flow rate of 200 standard liters/min. The flame gases were rapidly quenched by spraying water directly into the flame using air-assisted bi-fluid atomizers and approximately 15 centimeters from the burner tip. Additional air at 900 standard liters/min was added downstream of the burner to cool the product particles and the gases furthermore before entering the baghouse filter for particle collection.

Figure 5:
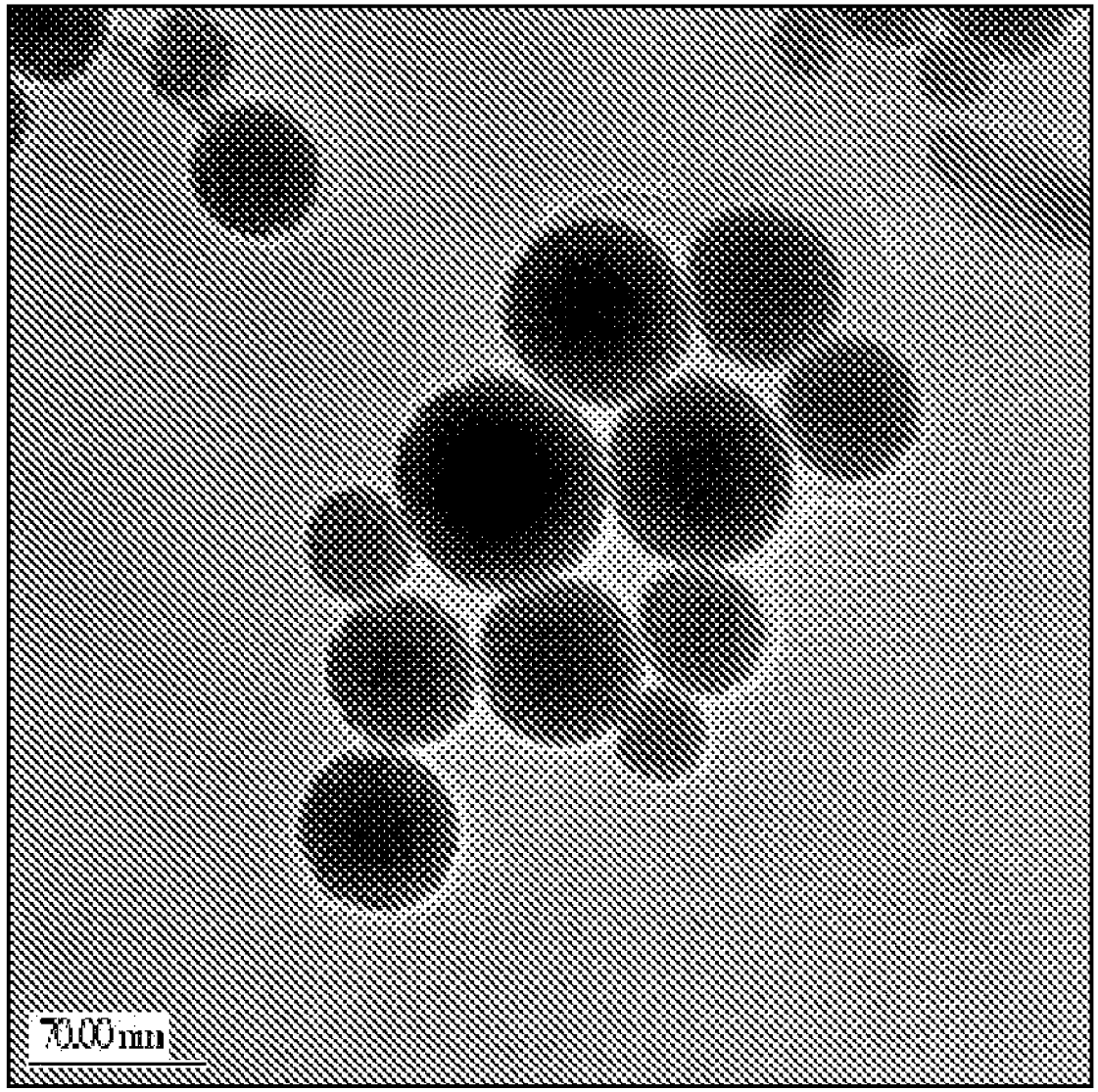
FIG. 5 is a transmission electron microscope (TEM) micrograph of nanoglass particles produced under the process conditions of Example 2.

The BET surface area measured by $N_2$ adsorption was 14.5 $m^2/g$ and the average aggregate size measured by quasi elastic light scattering was 168 nm. The density of the particles determined by He pycnometry was 5.54 $g/cm^3$. The particles were in the form of aggregates comprising of primary particles of average size 75 nm as was calculated from the BET surface area. FIG. 5 is a typical transmission electron microscopy (TEM) micrograph of aggregated nanoglass particles produced under these conditions.

Figure 6:
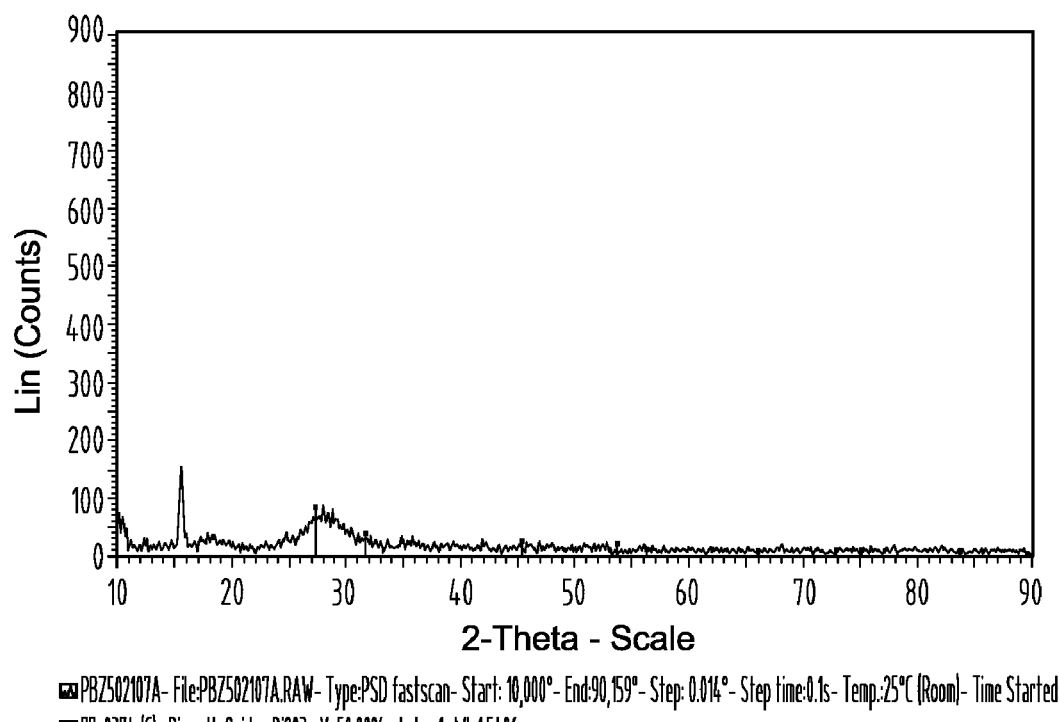
FIG. 6 is the XRD pattern of the particles which shows their amorphous nature of the material produced in Example 2.

FIG. 6 is the X-ray Diffraction (XRD) pattern of the particles which shows their amorphous nature of the material produced at the conditions described above. The weak crystalline peaks at low 2θ angles are attributed to $Bi_2O_3$ crystals.

Figure 7:
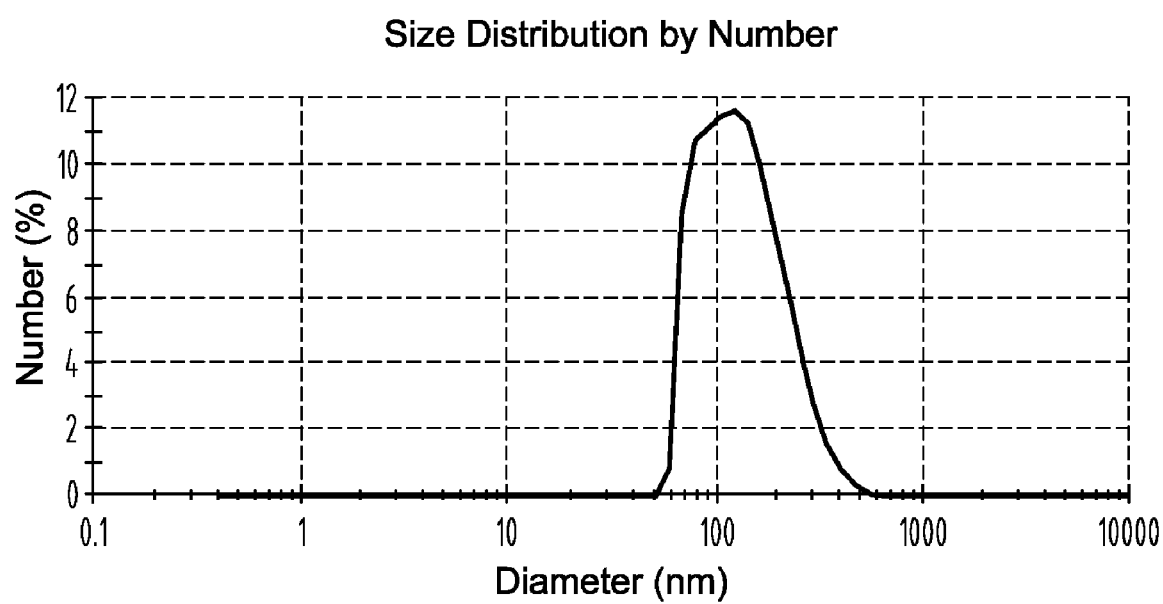
FIG. 7 is a graph of the aggregated size distribution of particles measured by quasi-elastic light scattering produced in Example 2.

FIG. 7 shows the particle size distribution of the particles as was measured by quasi-elastic light scattering.

Example 3

Nanoglass particles with nominal composition of $Bi_2O_3$: 80 wt %, $B_2O_3$:5 wt %, SrO:5 wt %, ZnO:5 wt % and $SiO_2$:5 wt % were prepared by spraying a precursor solution containing bismuth nitrate pentahydrate ($Bi(NO_3)_3 \cdot 5H_2O$), boric acid ($H_3BO_3$), strontium nitrate ($Sr(NO_3)_2$), zinc nitrate ($Zn(NO_3)_2 \cdot 6H_2O$) and hexamethyldisiloxane (($CH_3)_3SiOSi(CH_3)_3$) dissolved in a 1.68:1 (wt/wt) mixture of ethanol ($CH_3CH_2OH$) and ethylene glycol ($HOCH_2CH_2OH$) into a self-supporting flame. The total solvent concentration in the precursor solution was 85 wt % and the total metal loading of the precursor solution was 5.97 wt %. The precursor solution was atomized with a bi-fluid nozzle at a flow rate of 25 ml/min. Oxygen at 40 standard liters/min was used to atomize the precursor solution and supplemental oxygen at 40 standard liters/min was used to ensure complete combustion. The flame had an orange color. The flame was surrounded by an air stream at a flow rate of 200 standard liters/min. The flame gases were rapidly quenched by spraying water directly into the flame using air-assisted bi-fluid atomizers and approximately 15 centimeters from the burner tip. Additional air at 900 standard liters/min was added downstream of the burner to cool the product particles and the gases furthermore before entering the baghouse filter for particle collection.

The BET surface area measured by $N_2$ adsorption was 11.9 m2/g and the average aggregate size measured by quasi elastic light scattering was 187 nm. The density of the particles determined by He pycnometry was 6.63 g/cm3. The particles were in the form of aggregates comprising of primary particles of average size 76 nm as was calculated from the BET surface area.

Figure 8:
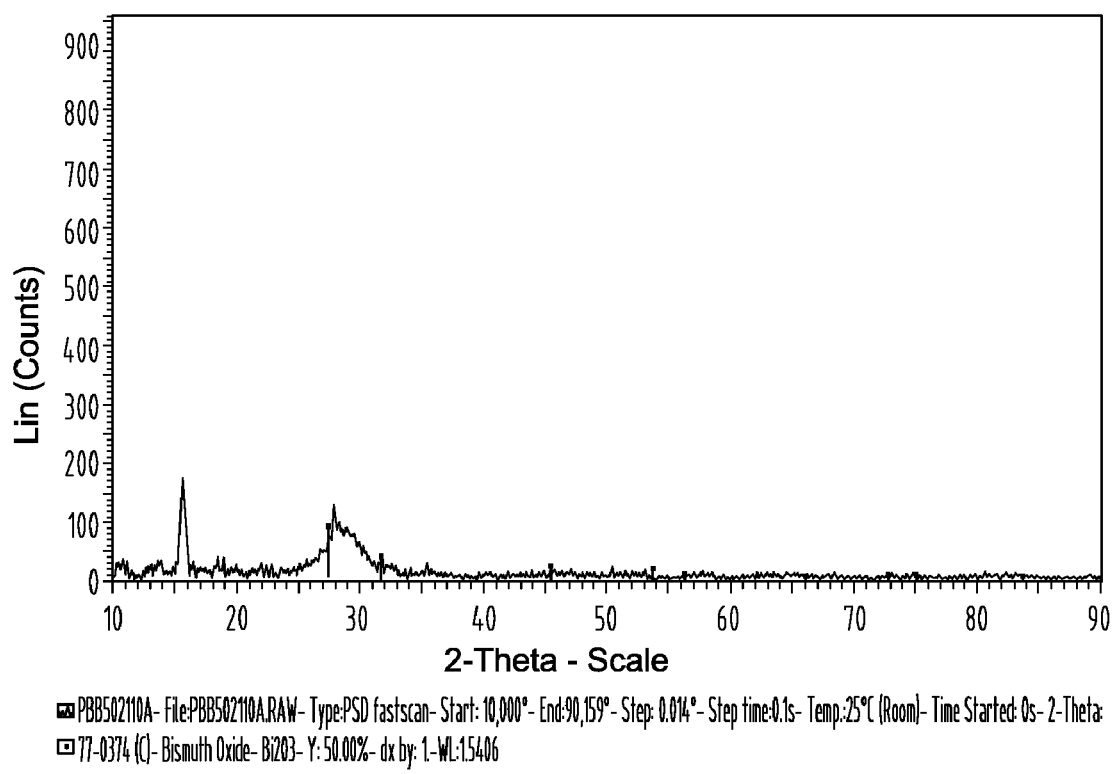
FIG. 8 is the XRD pattern of the particles which shows their amorphous nature of the material produced in Example 3.

FIG. 8 XRD pattern of nanoglass particles produced under the conditions of Example 3 and reflecting the amorphous nature of the nanoglass particles formed.

Figure 9:
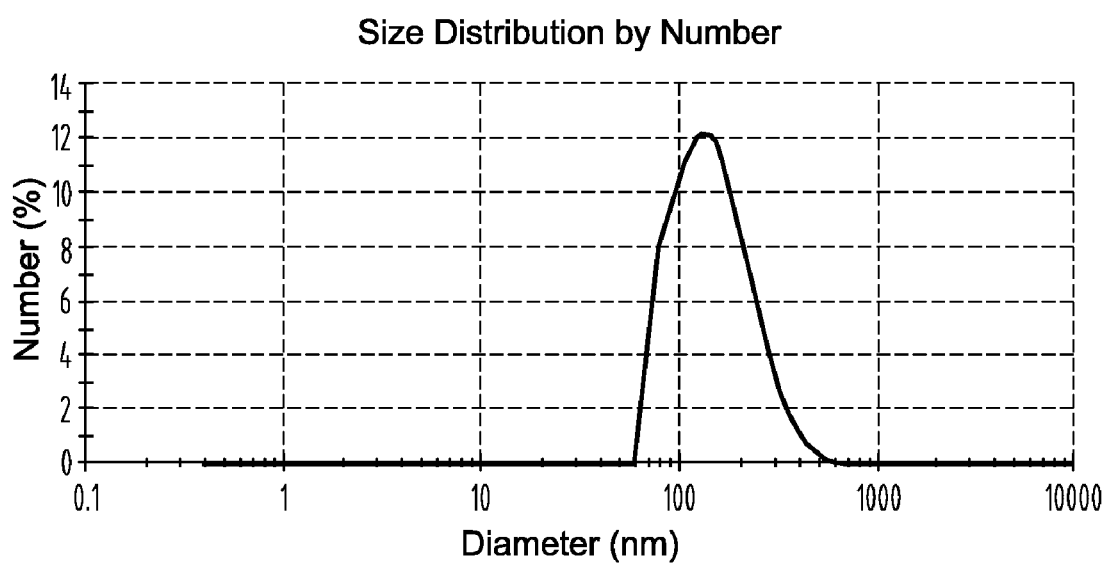
FIG. 9 is a graph of the aggregated size distribution of particles measured by quasi-elastic light scattering produced in Example 3.

FIG. 9 Particle size distribution of nanoglass particles produced under the conditions of Example 3 measured by quasi-elastic light scattering.

TABLE 2

| Example | Composition (wt %) | BET Surface Area | Average Aggregate Size (nm) |
| --- | --- | --- | --- |
| Ex. 1 | 88.2%: $Bi_2O_3$, 5.9%: $B_2O_3$, 5.9%: $SiO_2$ | 11.9 | 244.9 |
| Ex. 2 | 55.2%: $Bi_2O_3$, 22.9%: $B_2O_3$, 21.9%: ZnO | 14.5 | 168.5 |
| Ex. 3 | 80%: $Bi_2O_3$, 5%: $B_2O_3$, 5%: SrO, 5%: ZnO, 5%: $SiO_2$ | 11.9 | 186.8 |

Example 4

Figure 10:
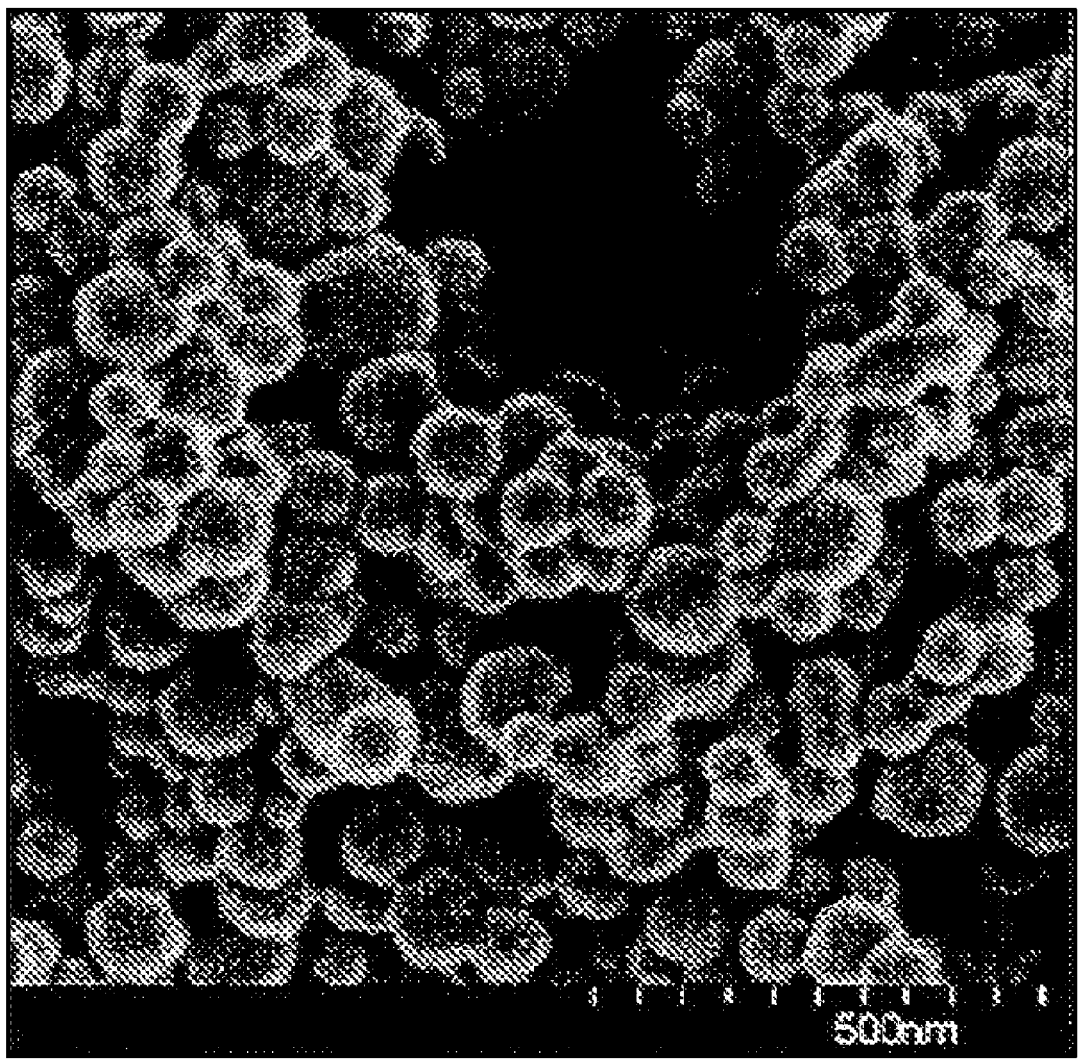
FIG. 10 is a scanning transmission electron microscopy (STEM) micrograph of a nanocomposite containing a silver core 99 wt % and a shell ($Bi_2O_3$ 55 wt %; $B_2O_3$ 23 wt %; and ZnO 22 wt %) 1 wt %.

A silver-metal oxide composite was prepared using Ag 99 wt % and 1 wt % of the nanoglass particles of Example 2. A STEM image of composite B nanoparticles is shown in FIG. 10.

Composite blends such as the blend of Example 4 may be used, for example, in the formation of photovoltaic conductive features in which the silver phase forms a conductive electrode on a substrate, and wherein the nanoglass etches an antireflective later (e.g., silicon nitride layer) of the substrate to facilitate formation of electrical contact between the conductive electrode and the underlying emitter layers of the photovoltaic cell. In such an example, the nanoglass particles can be mixed with the silver particles in either a paste or ink formulation and can be deposited onto the substrate by a number of different methods including, but not limited to, screen printing, aerosol printing and ink-jet printing.

Any feature described or claimed with respect to any disclosed implementation may be combined in any combination with any one or more other feature(s) described or claimed with respect to any other disclosed implementation or implementations, to the extent that the features are not necessarily technically incompatible, and all such combinations are within the scope of the present invention. Furthermore, the claims appended below set forth some non-limiting combinations of features within the scope of the invention, but also contemplated as being within the scope of the invention are all possible combinations of the subject matter of any two or more of the claims, in any possible combination, provided that the combination is not necessarily technically incompatible.

What is claimed is:

1. A nanoglass powder batch, comprising aggregated nanoglass particles, wherein each aggregated nanoglass particle comprises a plurality of primary nanoglass particles having an average primary particle size of from 25 nm to 500 nm, and wherein the aggregated nanoglass particles have an average aggregate particle size of from 50 nm to 1000 nm, and wherein at least 80 weight percent of the aggregated nanoglass particles are 1.25 to 3.0 times larger than the average primary particle size.

2. The nanoglass powder batch of claim 1, wherein the primary nanoglass particles comprise a mixture of a plurality of metal oxides, the metal oxides being selected from the group consisting of $SiO_2$, NiO, $Ni_2O_3$, $Al_2O_3$, $Bi_2O_3$, $B_2O_3$, $P_2O_5$, $GeO_2$, ZnO, $TiO_2$, $WO_3$, $MoO_3$, $V_2O_5$, MnO, $HfO_2$, $In_2O_3$, $Ga_2O_3$, $Ta_2O_5$, $Sb_2O_3$, $Sb_2O_5$, CdO, PbO, alkali oxides, and alkaline oxides.

3. The nanoglass powder batch of claim 1, wherein the primary nanoglass particles comprise $Bi_7O_3$ in an amount ranging from 65.0 to 85.0 wt % based on the total weight of the primary nanoglass particles, and $B_2O_3$ in an amount ranging from 15.0 to 35.0 wt %, based on the total weight of the primary nanoglass particles.

4. The nanoglass powder batch of claim 1, wherein the aggregated nanoglass particles have a density of at least 80 percent of the theoretical density of the aggregated nanoglass particles.

5. The nanoglass powder batch of claim 1, wherein the primary nanoglass particles are substantially spherical, and wherein the aggregated nanoglass particles are substantially spherical.

6. The nanoglass powder batch of claim 1, wherein the nanoglass powder batch is included in an electronic device.

7. The nanoglass powder batch of claim 1, wherein the nanoglass powder batch is included in a display circuit, a photovoltaic circuit, an ink, a dental composition, or an electronic device.

8. The nanoglass powder batch of claim 1, wherein the nanoglass is substantially amorphous as determined by X-Ray Diffraction.

9. The nanoglass powder batch of claim 1, wherein the nanoglass powder batch is produced by a process comprising:
providing a precursor medium comprising a first metal oxide precursor to a first metal oxide, a second metal oxide precursor to a second metal oxide, and a liquid vehicle; and
flame spraying the precursor medium under conditions effective to form aggregated nanoglass particles comprising the first and second metal oxides, wherein the aggregated nanoglass particles have an average primary particle size of from 25 nm to 500 nm.

10. The nanoglass powder batch of claim 9, wherein the flame spraying comprises:

introducing the precursor medium into a flame reactor heated by at least one flame to form a flowing stream of nanoglass particles comprising a mixture of the metal oxides; and growing the aggregated nanoglass particles in the flowing stream.

11. The nanoglass powder batch of claim 9, wherein the flame has a maximum temperature ranging from 1000° C. to 3000° C.

12. The nanoglass powder batch of claim 9, wherein the precursor medium resides in the flame from 10 to 500 milliseconds.

13. The nanoglass powder batch of claim 9, wherein the first and second metal oxide precursors or the precursor medium are non-volatile.

14. The nanoglass powder batch of claim 9, wherein the first and second metal oxide precursors are selected from the group consisting of boric acid, alkyldisiloxanes, and nitrites, nitrate hydrates, and carboxylates of lithium, sodium, potassium, rubidium, cesium, beryllium, magnesium, calcium, strontium, barium, titanium, hafnium, vanadium, tantalum, molybdenum, tungsten, manganese, zinc, cadmium, boron, aluminum, gallium, indium, silicon, germanium, lead, phosphorus, antimony, and bismuth.

15. The nanoglass powder batch of claim 9, wherein the first and second metal oxide precursors are selected from the group consisting of boric acid, bismuth nitrate pentahydrate, and hexamethyldisiloxane.

16. The nanoglass powder batch of claim 9, wherein each of the first and second metal oxide precursors decompose at a temperature within 25° C. to 1000° C. of each other.

17. The nanoglass powder batch of claim 9, wherein the liquid vehicle is a solvent.

18. The nanoglass powder batch of claim 17, wherein the solvent is selected from the group consisting of alcohols, diols, and mixtures thereof.

19. The nanoglass powder batch of claim 9, wherein the precursor medium further comprises a third metal oxide precursor to a third metal oxide.

20. The nanoglass powder batch of claim 9, wherein the process further comprises:

cooling the aggregated nanoglass particles to prevent further aggregation.

21. A nanoglass powder batch comprising aggregated nanoglass particles, wherein each aggregated nanoglass particle comprises a plurality of primary nanoglass particles having an average primary particle size of from 25 nm to 500 nm, wherein the aggregated nanoglass particles have an average aggregate particle size of from 50 nm to 1000 nm, and wherein the primary nanoglass particles comprise $Bi_2O_3$ in an amount ranging from 65.0 to 85.0 wt % based on the total weight of the primary nanoglass particles, and $B_2O_3$ in an amount ranging from 15.0 to 35.0 wt %, based on the total weight of the primary nanoglass particles.

22. The nanoglass powder batch of claim 21, wherein the nanoglass powder batch is included in a display circuit, a photovoltaic circuit, an ink, a dental composition, or an electronic device.

* * * * *